(12) United States Patent
Bang

(10) Patent No.: US 12,027,657 B2
(45) Date of Patent: Jul. 2, 2024

(54) LIGHT EMITTING DIODE, LIGHT EMITTING DIODE MODULE, AND DISPLAY DEVICE INCLUDING THE SAME

(71) Applicant: SEOUL SEMICONDUCTOR CO., LTD., Ansan-si (KR)

(72) Inventor: Se Min Bang, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 18/362,732

(22) Filed: Jul. 31, 2023

(65) Prior Publication Data

US 2024/0063357 A1 Feb. 22, 2024

Related U.S. Application Data

(63) Continuation of application No. 17/592,411, filed on Feb. 3, 2022, now Pat. No. 11,749,792, which is a
(Continued)

(30) Foreign Application Priority Data

Sep. 29, 2017 (KR) .......................... 10-2017-0127381

(51) Int. Cl.
*H01L 33/62* (2010.01)
*H01L 33/50* (2010.01)
(Continued)

(52) U.S. Cl.
CPC ............ *H01L 33/62* (2013.01); *H01L 33/502* (2013.01); *H01L 33/56* (2013.01); *H01L 33/642* (2013.01)

(58) Field of Classification Search
CPC ....... H01L 33/62; H01L 33/502; H01L 33/56; H01L 33/642; H01L 33/647;
(Continued)

(56) References Cited

U.S. PATENT DOCUMENTS 11,251,351 B2  2/2022  Bang
2008/0303048 A1  12/2008  Hsieh
(Continued)

FOREIGN PATENT DOCUMENTS

KR    1020100102893 A    9/2010
KR    1020110045273 A    5/2011
(Continued)

OTHER PUBLICATIONS

Office Action issued in corresponding KR Application No. 1020170127381, issued Sep. 23, 2021 (4 pages).
(Continued)

*Primary Examiner* — Jonathan Han
(74) *Attorney, Agent, or Firm* — Perkins Coie LLP

(57) ABSTRACT

A light emitting diode having an improved heat dissipation effect includes a light source unit emitting a light to a front surface and including a light emitting part, a first electrode pad, and a second electrode pad. The light emitting diode further includes a lead frame unit disposed on a rear surface of the light source unit and including first and second lead terminals respectively connected to the first and second electrode pads. The light emitting diode also includes at least one of the first and second lead terminals includes an upper conductive layer, an intermediate conductive layer, and a lower conductive layer which are disposed on different layers and electrically connected to one another.

20 Claims, 31 Drawing Sheets

Related U.S. Application Data continuation of application No. 16/819,624, filed on Mar. 16, 2020, now Pat. No. 11,251,351, which is a continuation of application No. PCT/KR2018/011079, filed on Sep. 19, 2018.

(51) Int. Cl.
*H01L 33/56* (2010.01)
*H01L 33/64* (2010.01)

(58) Field of Classification Search
CPC ..... H01L 2933/0041; H01L 2933/0066; H01L 33/486; H01L 33/64; H01L 33/50; H01L 25/0753; H01L 33/36; H01L 33/501; G02F 1/133615; G09F 9/33
See application file for complete search history.

(56) References Cited

U.S. PATENT DOCUMENTS

| | | | |
|---|---|---|---|
| 2013/0278134 A1 | 10/2013 | Ko et al. | |
| 2014/0110745 A1 | 4/2014 | Lee et al. | |
| 2015/0049510 A1* | 2/2015 | Haiberger | G02B 6/0073 257/98 |
| 2015/0155456 A1* | 6/2015 | Kuramoto | H01L 33/46 257/98 |
| 2015/0214453 A1 | 7/2015 | Jung et al. | |
| 2016/0086927 A1 | 3/2016 | Sasaoka et al. | |
| 2017/0125651 A1 | 5/2017 | Kishikawa | |
| 2017/0186921 A1 | 6/2017 | Kim | |
| 2020/0220060 A1 | 7/2020 | Bang | |
| 2022/0158064 A1 | 5/2022 | Bang | |

FOREIGN PATENT DOCUMENTS

| | | |
|---|---|---|
| KR | 1020110080474 | 7/2011 |
| KR | 1020120051502 A | 5/2012 |
| KR | 1020120083815 A | 7/2012 |
| KR | 10-1645009 | 8/2016 |
| KR | 10-2017-0075897 | 7/2017 |
| KR | 1020170075897 A | 7/2017 |

OTHER PUBLICATIONS

Office Action issued in corresponding CN Application No. 1201880006297, issued Oct. 11, 2021 (10 pages).

International Search Report for International Application PCT/KR2018/011079, mailed Feb. 27, 2019.

English translation of Korean Office Action issued in corresponding KR Application No. 1020170127381, dated Mar. 25, 2022. (5 pages).

* cited by examiner

LIGHT EMITTING DIODE, LIGHT EMITTING DIODE MODULE, AND DISPLAY DEVICE INCLUDING THE SAME

CROSS-REFERENCE TO RELATED APPLICATIONS

This application is a continuation of U.S. patent application Ser. No. 17/592,411, filed on Feb. 3, 2022, which is a continuation of U.S. patent application Ser. No. 16/819,624, filed on Mar. 16, 2020, which is a continuation of PCT Application No. PCT/KR2018/011079, filed on Sep. 19, 2018, which claims priority to and the benefit of Korean Patent Application No. 10-2017-0127381, filed on Sep. 29, 2017. The disclosures of the aforementioned applications are hereby incorporated herein by reference in their entireties.

BACKGROUND

1. Technical Field

The present disclosure relates to a light emitting diode, a light emitting diode module, and a display device including the same.

2. Related Art

In general, a light emitting diode may be largely classified into a top type light emitting diode and a side type, or lateral type light emitting diode. The side type light emitting diode package is widely used as a light source for a backlight of a display device in which light is incident on a side of a light guide plate. Recently, the side type light emitting diode package has been widely used or utilized in addition to the backlight of the existing display device.

Recently, as a thickness of the display device is thin, it is desirable that a thickness of the side type light emitting diode package is also thin. However, as the thickness of the conventional side type light emitting diode package becomes thin, a space between a light emitting diode chip and a reflector becomes narrow and a heat dissipation design may be needed to accommodate a temperature rise.

SUMMARY

An object of the present invention is to provide a light emitting diode with an improved heat dissipation structure, a light emitting diode module, and a display device including the same.

A light emitting diode according to an embodiment of the present disclosure has an improved heat dissipation effect.

A light emitting diode according to an embodiment of the present invention includes a light source unit emitting a light to a front surface and including a light emitting part, a first electrode pad, and a second electrode pad; and a lead frame unit disposed on a rear surface of the light source unit and including first and second lead terminals respectively connected to the first and second electrode pads, wherein a first lead terminal structure and a second lead terminal structure, wherein the first lead terminal structure, the second lead terminal structure, or both include an upper conductive layer, an intermediate conductive layer, and a lower conductive layer which are disposed on different layers and electrically connected to one another.

In an embodiment, the lead frame unit further includes a first insulating substrate and a second insulating substrate, the upper conductive layer is disposed between the light source unit and the first insulating substrate, the intermediate conductive layer is disposed between the first insulating substrate and the second insulating substrate, and the lower conductive layer is disposed on the second insulating substrate and disposed on an opposite side to a side on which the intermediate conductive layer is disposed.

In some embodiments, the lead frame unit further includes a dummy terminal insulated from the first and second lead terminals. When viewed in a plan view, the dummy terminal is disposed between the first lead terminal and the second lead terminal.

In another embodiment, the light emitting diode further includes a dummy terminal structure that includes the dummy terminal, an intermediate dummy layer disposed between the first insulating substrate and the second insulating substrate; and a lower dummy layer disposed on the second insulating substrate, the lower dummy layer being disposed on an opposite side to a side on which the intermediate dummy layer is disposed.

In yet another embodiment, the intermediate dummy layer and the intermediate conductive layer are electrically insulated from each other, and the lower dummy layer and the lower conductive layer are electrically insulated from each other.

In yet another embodiment, the second insulating substrate is partially removed to have a dummy solder hole, and the intermediate dummy layer and the lower dummy layer are electrically connected to each other through a solder paste disposed in the dummy solder hole.

In yet another embodiment, the first and second insulating substrates are partially removed to each have at least one via hole and the upper conductive layer and the intermediate conductive layer are electrically connected to each other through a contact part disposed in the via hole.

In yet another embodiment, the second insulating substrate has at least one solder hole exposing a rear surface of the intermediate conductive layer. The lower conductive layer has the same opening as the solder hole.

In yet another embodiment, the light emitting diode further includes a solder paste disposed in the solder hole.

In yet another embodiment, the light emitting part, the first electrode pad, and the second electrode pad form the light emitting diode, and the light emitting diode is disposed on the lead frame unit.

In yet another embodiment, the light emitting diode is flip type.

In some embodiments, the light emitting diode further includes a wavelength converter covering the light emitting diode and converting at least a portion of the light emitted from the light emitting diode. In an embodiment, the wavelength converter includes a phosphor.

In some embodiments, the light emitting diode further includes a transparent part covering the wavelength converter. In yet another embodiment, the light emitting diode further includes an insulating part surrounding circumferences of the light emitting diode, the wavelength converter, and the transparent part when viewed in plan view. In an embodiment, when viewed in plan view, the insulating part partially overlaps with the wavelength converter. When viewed in plan view, the insulating part is spaced apart from the wavelength converter. In yet another embodiment, wherein, when viewed in plan view, the insulating part is in contact with the wavelength converter.

In some embodiments, the upper conductive layer includes a first upper conductive layer electrically connected to the first lead terminal and a second upper conductive layer connected to the second lead terminal, and at least one of the first and second upper conductive layers is exposed to the outside.

In yet another embodiment, the intermediate conductive layer includes a first intermediate conductive layer electrically connected to the first lead terminal and a second intermediate conductive layer connected to the second lead terminal, and at least one of the first and second intermediate conductive layers is exposed to the outside.

A light emitting diode module according to an embodiment of the present disclosure includes a light source unit emitting a light to a front surface and including a light emitting part, a first electrode pad, and a second electrode pad; a lead frame unit disposed on a rear surface of the light source unit and including first and second lead terminals connected to the first and second electrode pads, respectively; and a substrate disposed on side surfaces of the light source unit and the lead frame unit and electrically connected to the first and second lead terminals, wherein at least one of the first and second lead terminals includes an upper conductive layer, an intermediate conductive layer, and a lower conductive layer which are disposed on different layers and electrically connected to one another.

A display device according to an embodiment of the present disclosure includes a display panel; a light guide plate disposed on one side of the display panel, having a first surface on which light is incident and a second surface on which the light is emitted, and facing the display panel; and a light emitting diode module providing the light to the first surface of the light guide plate, wherein the light emitting diode module includes a light source unit including a light emitting part, a first electrode pad, and a second electrode pad and emitting the light to a front surface; a lead frame unit disposed on a rear surface of the light source unit and including first and second lead terminals connected to the first and second electrode pads, respectively; and a substrate disposed on side surfaces of the light source unit and the lead frame unit and electrically connected to the first and second lead terminals, wherein at least one of the first and second lead terminals includes an upper conductive layer, an intermediate conductive layer, and a lower conductive layer which are disposed on different layers and electrically connected to one another.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 2A illustrates a perspective view of the lead frame unit 100 of FIG. 1; FIGS. 2B-2D illustrate plan views of the first conductive layer 130, the second conductive layer 140, and the third conductive layer 150 included in the lead frame unit 100, respectively; FIG. 2E is a cross-sectional view of the lead frame unit 100 taken along a line I-I' of FIG. 2.

FIG. 3A is a perspective view of the light emitting diode unit 10, and FIGS. 3B to 3F illustrate cross-sectional views of the light source unit 200 taken along a line II-II' of FIG. 3A;

FIG. 4A is a schematic plan view of the light emitting diode chip 210 according to an embodiment of the present invention; and FIGS. 4B, 4C, and 4D illustrate schematic cross-sectional views taken along lines A-A, B-B, and C-C of FIG. 4A, respectively;

FIG. 5A illustrates an example of a process of bonding the light emitting diode 10 to the substrate 300 using a solder paste "1"; FIG. 5B is a view illustrating an example of a completed light emitting diode module; FIG. 5C is a cross-sectional view taken along a line of A-A' of FIG. 5B; and FIG. 5D is a cross-sectional view taken along a line B-B' of FIG. 5B;

FIG. 6A is a perspective view showing an overall appearance of the light emitting diode 10 according to another embodiment of the present disclosure; and FIGS. 6B to 6D are plan views illustrating the first conductive layer 130, the second conductive layer 140, and the third conductive layer 150 included in a lead frame unit 100' of FIG. 6A, respectively;

FIG. 7A illustrates an example of bonding the light emitting diode 20 to the substrate 300 using the solder paste "2"; and FIG. 7B is a view illustrating an example of a completed light emitting diode module;

FIG. 8A is a perspective view showing an overall appearance of the light emitting diode 30 according to another embodiment of the present disclosure; and FIGS. 8B to 8D are plan views illustrating the first conductive layer 130, the second conductive layer 140, and the third conductive layer 150 included in a lead frame unit 100" of FIG. 8A, respectively;

FIG. 10A is a perspective view showing an overall appearance of the light emitting diode 40 according to another embodiment of the present disclosure; and FIGS. 10B to 10D are plan views illustrating a first conductive layer 130''', a second conductive layer 140''', and the third conductive layer 150 included in a lead frame unit 100''' of FIG. 10A, respectively;

FIG. 11A is a perspective view illustrating an overall appearance of the light emitting diode 50 according to another embodiment of the present disclosure; and FIGS. 11B to 11D are plan views illustrating the first conductive layer 130, a second conductive layer 140"" and a third conductive layer 150"" included in a lead frame unit 100"" of FIG. 11A, respectively;

FIG. 13A is a perspective view showing an overall appearance of the light emitting diode 60 according to another embodiment of the present disclosure; and FIGS. 13B to 13D are plan views illustrating the first conductive layer 130, the second conductive layer 140, and the third conductive layer 150 included in the lead frame unit 100 of FIG. 13A, respectively.

DETAILED DESCRIPTION OF THE EMBODIMENTS

Figure 1:
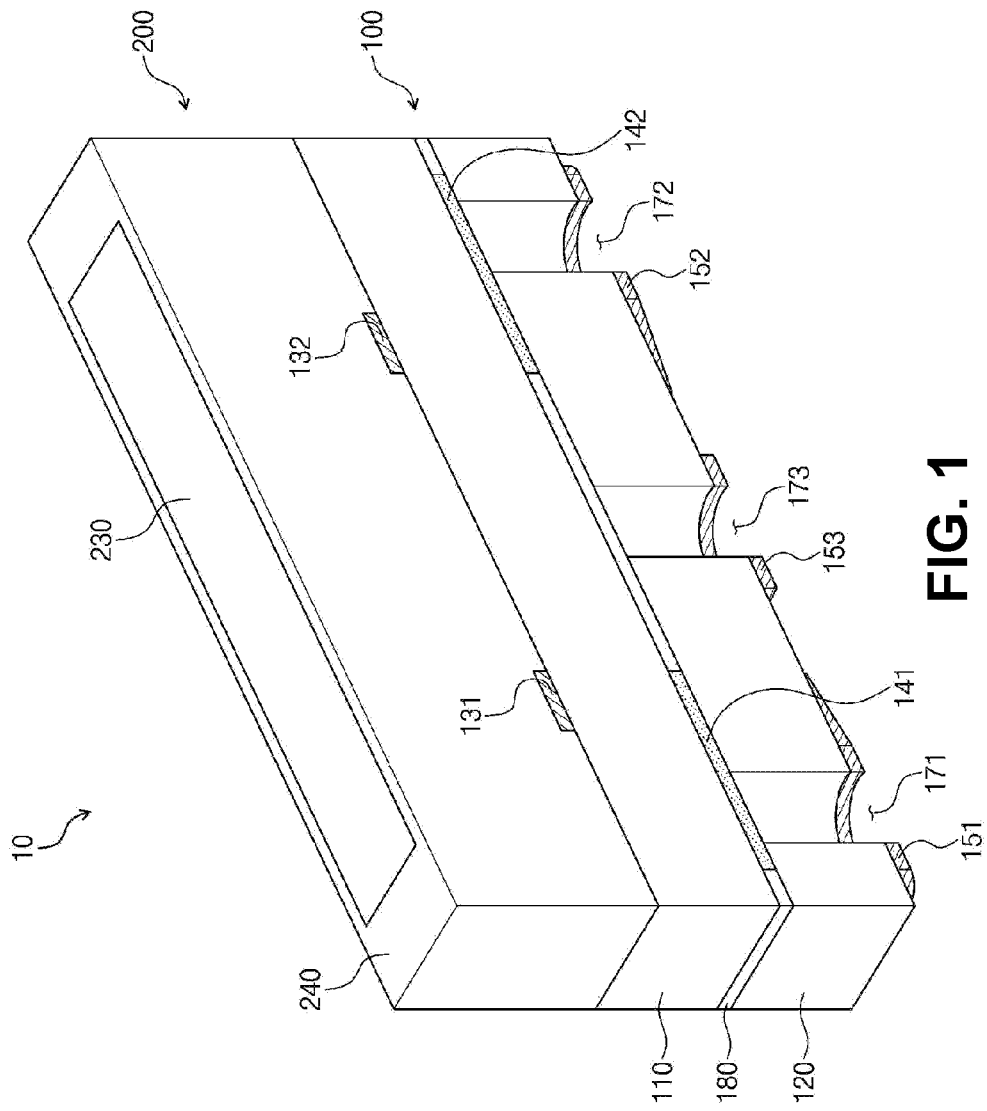
FIG. 1 is a perspective view briefly illustrating a light emitting diode according to an embodiment of the present disclosure.

The present invention may be modified in various ways and implemented by various exemplary embodiments, so that specific exemplary embodiments are illustrated in the drawings and will be described in detail below. However, it is to be understood that the present invention is not limited to the specific exemplary embodiments, but includes all modifications, equivalents, and substitutions included in the spirit and the scope of the present invention.

In describing the drawings, like reference numerals are used for like elements. In the accompanying drawings, the dimensions of the structures are shown in an enlarged scale than actual for clarity of the invention. It will be understood that, although the terms first, second, etc. may be used herein to describe various elements, these elements should not be limited by these teens. These terms are only used to distinguish one element from another. For example, a first element could be termed a second element, and, similarly, a second element could be termed a first element, without departing from the scope of the present invention. Singular expressions include plural expressions unless the context clearly indicates otherwise.

It will be understood that the terms "comprises" or "includes," when used herein, specify the presence of stated features, integers, steps, operations, elements, and/or components, but do not preclude the presence or addition of one or more other features, integers, steps, operations, elements, components, and/or groups thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further, when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

Hereinafter, a preferred embodiment of the present invention will be described in detail with reference to the accompanying drawings.

FIGS. 1 to 4 are views briefly illustrating a light emitting diode 10 according to embodiments of the present disclosure. Specifically, FIG. 1 is a perspective view illustrating the light emitting diode 10 according to embodiments of the present disclosure, and FIGS. 2 to 4 are views illustrating a light source unit 200 and a lead frame unit 100 of the light emitting diode 10 of FIG. 1 in detail. Referring to FIGS. 1 to 4, the light emitting diode 10 includes the lead frame unit 100 and the light source unit 200.

The light emitting diode 10 according to the embodiment of the present disclosure includes the lead frame unit 100 and the light source unit 200 mounted on the lead frame unit 100, and the lead frame unit 100 includes at least three conductive layers disposed on different layers. In particular, the light emitting diode 10 according to embodiments of the present disclosure may radiate heat inside the light emitting diode 10 to the outside through the at least three conductive layers, thereby providing an improved heat dissipation effect.

Referring to FIG. 1, the lead frame unit 100 is disposed with the light source unit 200 on an upper surface thereof and a lead frame structure which connects a light emitting diode chip 210 included in the light source unit 200 (shown in FIGS. 3B and 3C) to an external circuit. That is, the lead frame unit 100 is connected to the first and second electrode pads of the light emitting diode chip 210 included in the light source unit 200, respectively, and provides power required for light emission of the light source unit 200.

The light source unit 200 is disposed on the upper surface of the lead frame unit 100 and emits a light of a specific wavelength by the power supplied from the outside. For example, the light source unit 200 may include the light emitting diode chip 210, a transparent part 230 disposed on the front surface of the light emitting diode chip 210, and a housing 240 surrounding the light emitting diode chip 210 and the transparent part 230, and a light of a specific wavelength may be emitted through the transparent part 230. For example, the light source unit 200 may further include a wavelength converter 220 for converting the wavelength of the light emitted from the light emitting diode chip 210.

The lead frame unit 100 includes a first insulating substrate 110, a second insulating substrate 120, and a plurality of conductive layers. The plurality of conductive layers may include first to third conductive layers 130, 140, and 150 disposed on different layers.

The first conductive layer 130 is formed on the upper surface of the first insulating substrate 110. The first conductive layer 130 may include first and second upper conductive layers 131 and 132, and a portion of the first conductive layer 130 may be exposed to the outside. For example, as shown in FIG. 1, the portion of the first and second upper conductive layers 131 and 132 may be exposed to the outside through an opening formed in the housing of the light source unit 200. Meanwhile, this is merely exemplary, and the light emitting diode according to another embodiment of the present disclosure may not expose the first and/or second upper conductive layers 131 and 132 to the outside.

The second conductive layer 140 is formed between the first insulating substrate 110 and the second insulating substrate 120. The second conductive layer 140 may include a first intermediate conductive layer 141, a second intermediate conductive layer 142, and an intermediate dummy layer (not shown), and a portion of the second conductive layer 140 may be exposed to the outside. For example, as shown in FIG. 1, some of the first and second intermediate conductive layers 141 and 142 may be exposed to the outside through an opening formed in an adhesive layer 180 and the intermediate dummy layer may be blocked by the adhesive layer 180 and not exposed to the outside. However, this is merely exemplary, and the light emitting diode according to another embodiment of the present disclosure may not expose the first intermediate conductive layer 141, the second intermediate conductive layer 142, and/or the intermediate dummy layer to the outside.

The third conductive layer 150 is formed on a lower surface of the second insulating substrate 120. The third conductive layer 150 includes a first lower conductive layer 151, a second lower conductive layer 152, and a lower dummy layer 153, and has a shape corresponding to the second insulating substrate 120. For example, as illustrated in FIG. 1, the second insulating substrate 120 may include semicircular solder holes 171 to 173 formed by removing a portion thereof, and the first lower conductive layer 151, the second lower conductive layer 152 and the lower dummy layer 153 may be formed to have the same openings as the corresponding solder holes.

Figure 2A:
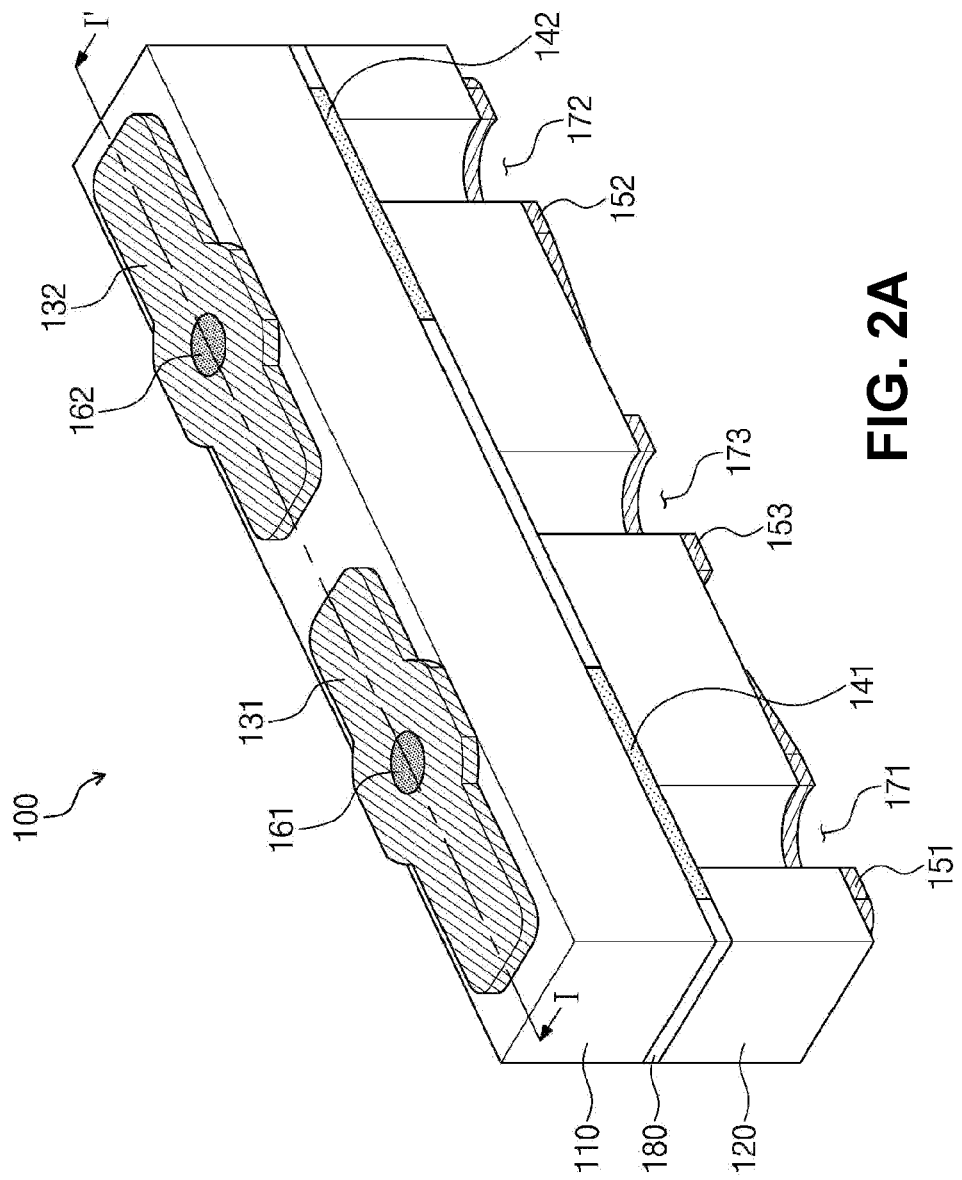
FIGS. 2A through 2E are views illustrating a lead frame unit of FIG. 1 in more detail, where
Figure 2B:
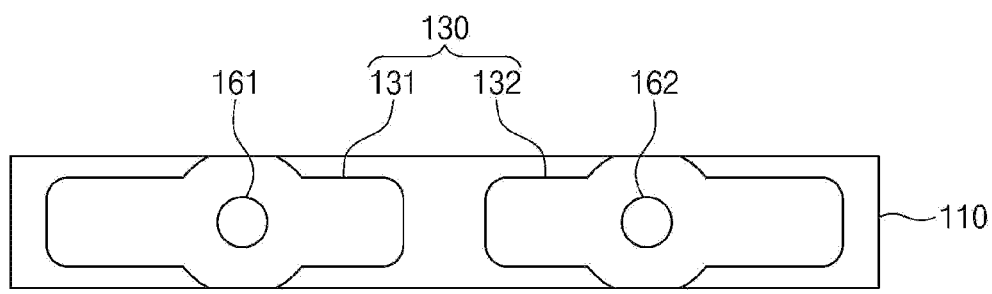
Figure 2C:
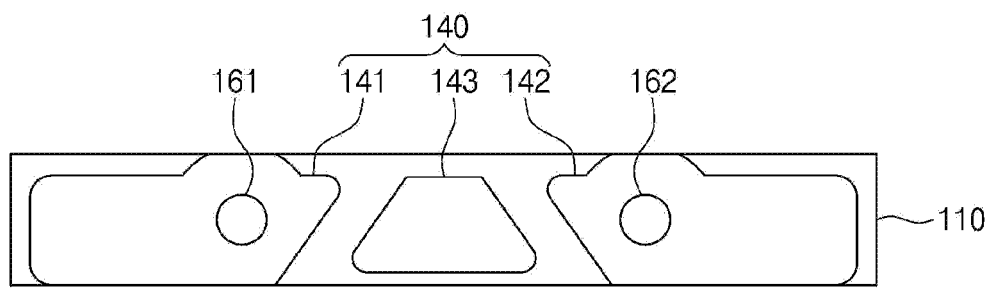
Figure 2D:
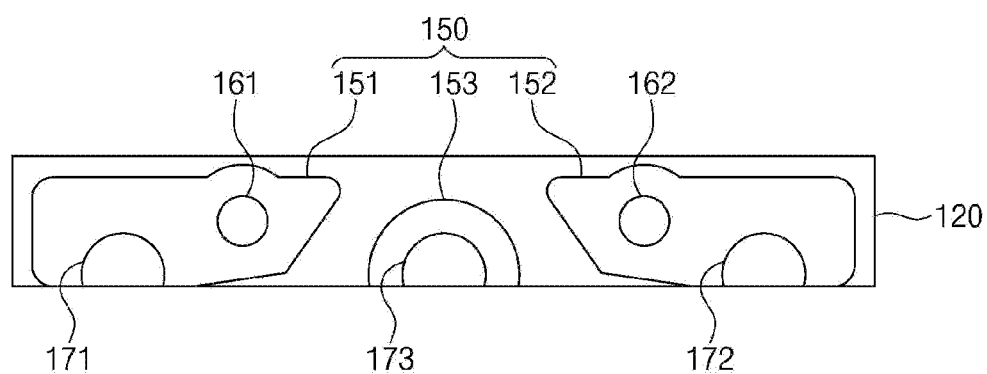
Figure 2E:
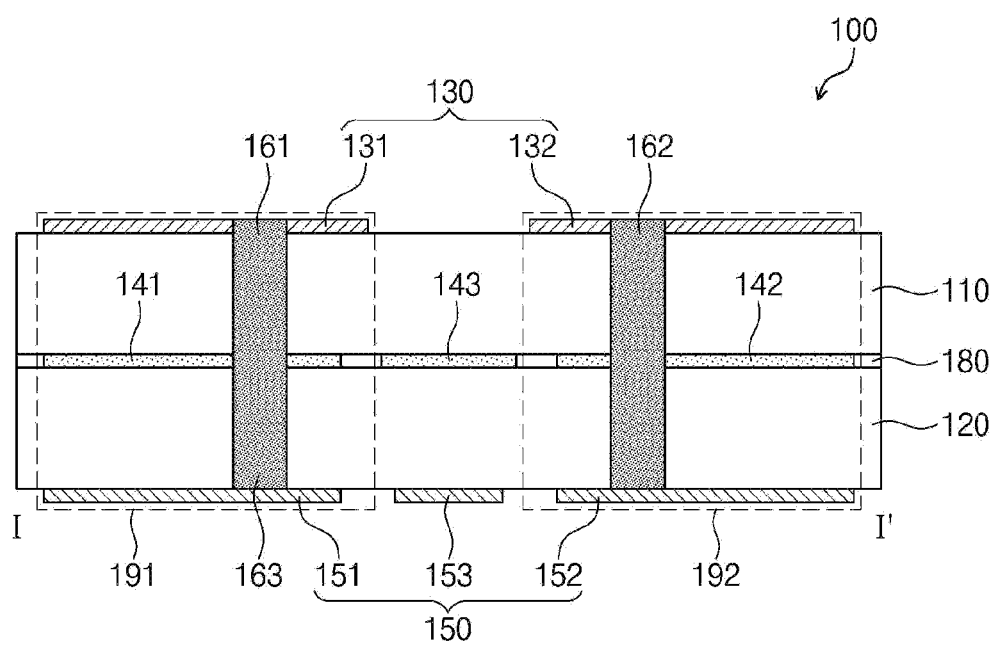

In some embodiments according to the present disclosure, the first upper conductive layer 131, the first intermediate conductive layer 141, and the first lower conductive layer 151 may be electrically connected to one another through the via holes formed in the first and second insulating substrates 110 and 120 to form a first lead terminal 191, as shown in FIG. 2E. In addition, the second upper conductive layer 132, the second intermediate conductive layer 142, and the second lower conductive layer 152 may be electrically connected to one another through the via holes formed in the first and second insulating substrates 110 and 120 to form a second lead terminal 192, as also shown in FIG. 2E. The first lead terminal 191 and the second lead terminal 192 may be electrically insulated by an insulating material and respectively connected to a first electrode pad and a second electrode pad of the light source unit 200.

In particular, the first and second lead terminals 191 and 192 according to embodiments of the present disclosure may include the first and second intermediate conductive layers 141 and 142 disposed between the first and second insulating substrates 110 and 120. The light emitting diode 10 according to embodiments of the present disclosure may radiate heat to the outside through the first and second intermediate conductive layers 141 and 142, and thus heat dissipation performance may be improved.

Figure 5A:
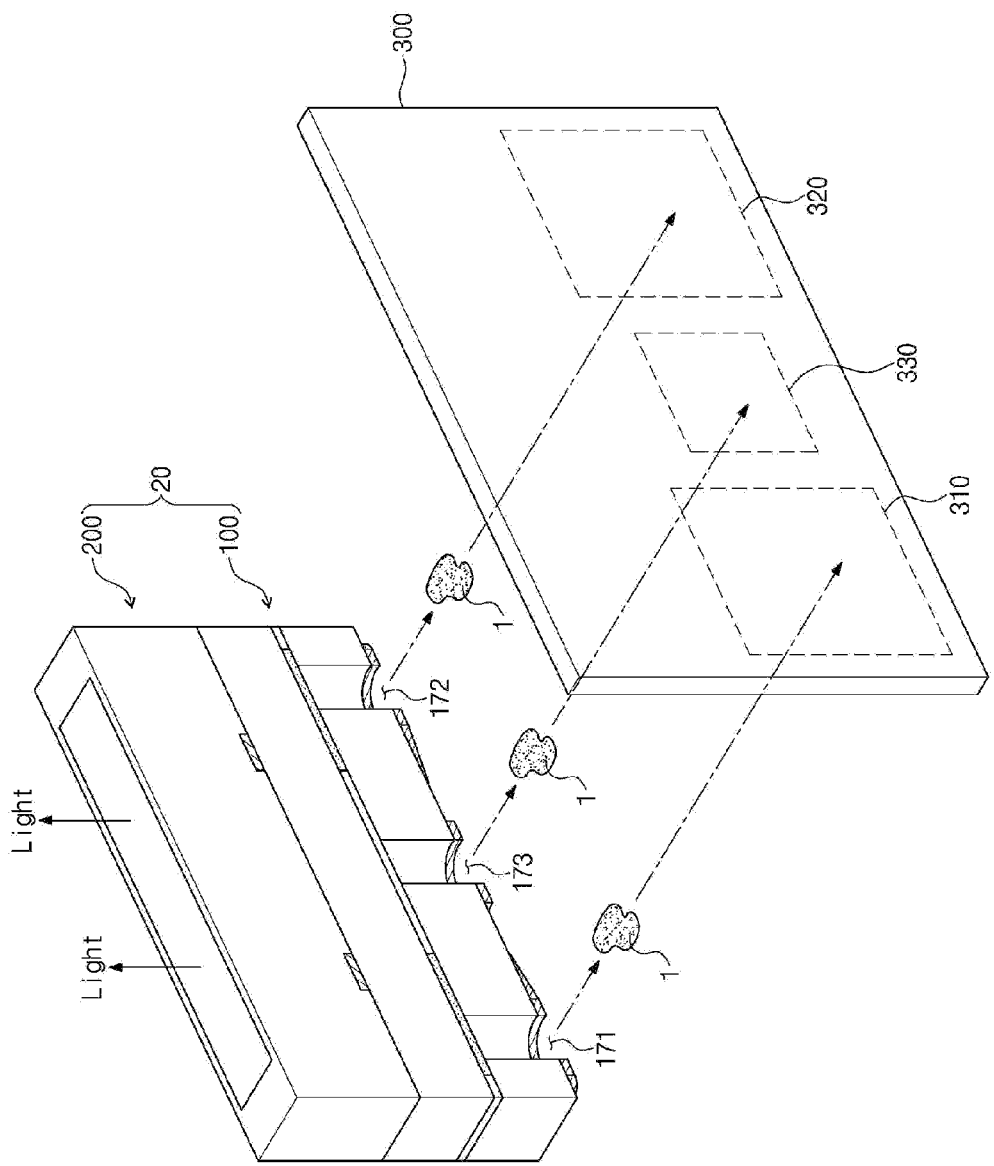
FIGS. 5A through 5D are views illustrating a light emitting diode module formed using a light emitting diode of FIG. 1, where
Figure 5B:
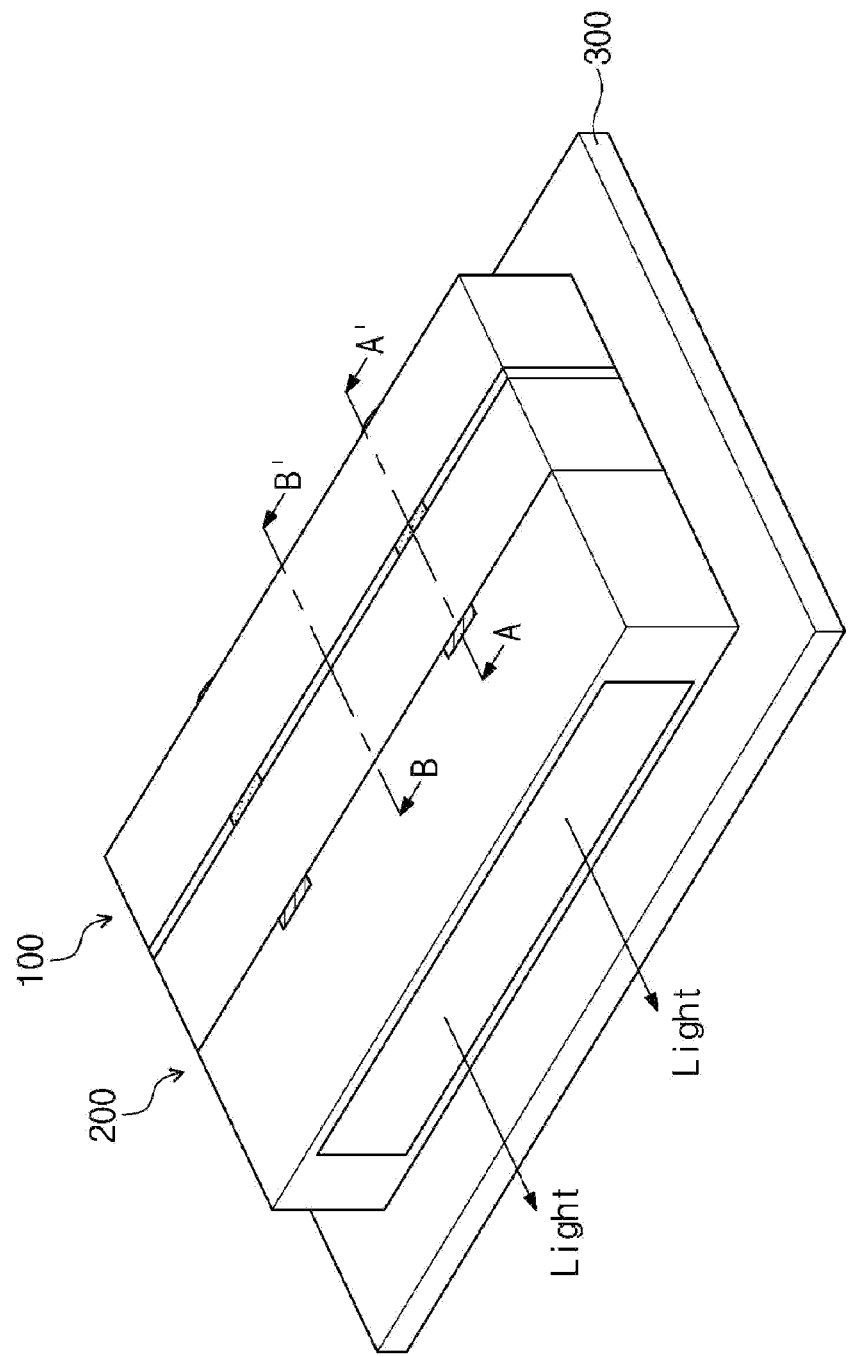
Figure 5C:
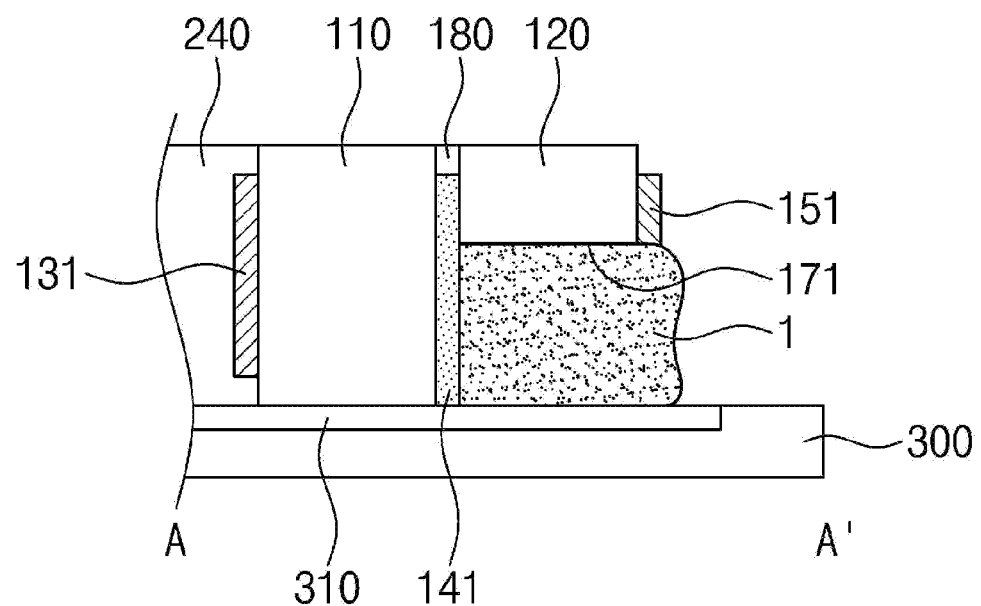
Figure 5D:
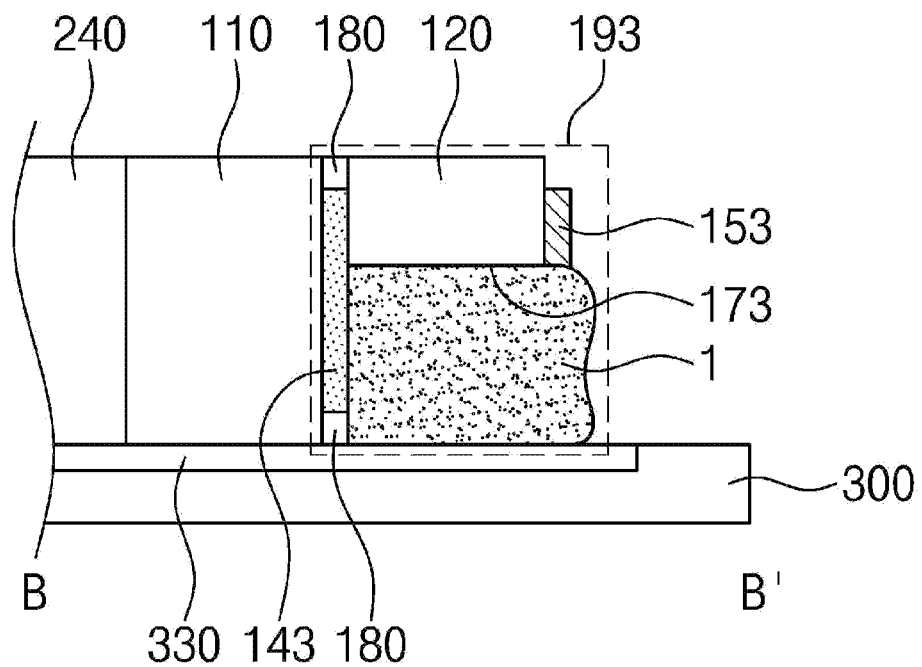

In addition, in embodiments according to the present disclosure, when a substrate is attached to the light emitting diode 10 to form a light emitting diode module, the intermediate dummy layer 143 and the lower dummy layer 153 may be electrically connected though a solder paste disposed in a dummy solder hole 173 to form a dummy terminal 193 (see FIG. 5D). In manufacturing the light emitting diode module, the dummy terminal according to embodiments of the present disclosure may not only firmly fix the light emitting diode 10 to the substrate but also additionally form a heat path for radiating heat of the light emitting diode 10 to the substrate. Thus, the heat dissipation performance may be further improved.

Meanwhile, in FIG. 1, the light emitting diode 10 is shown to have a substantially rectangular parallelepiped shape. However, this is merely exemplary, and the light emitting diode according to another exemplary embodiment of the present disclosure may have various forms in addition to a rectangular parallelepiped. Various other shapes may be available within the scope of the technical idea of the present disclosure. In addition, it will be understood that terms, i.e., front, side, and back, which will be described herein below are relative terms, which are changed depending on position or rotation of the light emitting diode or depending on a reference component.

Referring to FIGS. 2A to 2E, a perspective view of the lead frame unit 100 of FIG. 1 is illustrated in FIG. 2A, and plan views of the first conductive layer 130, the second conductive layer 140, and the third conductive layer 150 included in the lead frame unit 100 are illustrated in FIGS. 2B to 2D, respectively. FIG. 2E is a cross-sectional view of the lead frame unit 100 taken along a line I-I' of FIG. 2. Meanwhile, for clarity and simplicity, FIG. 2B mainly illustrates the shape of the first conductive layer 130 while omitting the second conductive layer 140 and the third conductive layer 150. Likewise, FIG. 2C mainly illustrates the shape of the second conductive layer 140 and FIG. 2D mainly illustrates the shape of the third conductive layer 150.

Referring to FIGS. 2A to 2E, the lead frame unit 100 includes the first insulating substrate 110, the second insulating substrate 120, the first conductive layer 130, the second conductive layer 140 and the third conductive layer 150.

First, referring to FIG. 2A, the first insulating substrate 110 and the second insulating substrate 120 are disposed. The first insulating substrate 110 and the second insulating substrate 120 are formed of an insulating material. For example, the first insulating substrate 110 and the second insulating substrate 120 may include an organic polymer material. As the organic polymer material, at least one resin selected from acrylic, polyester, polyurethane, epoxy, vinyl, polystyrene, polyamide, and urea may be used. However, this is exemplary and the material is not particularly limited as long as it has insulation.

Referring to FIGS. 2A and 2B, the first conductive layer 130 is formed on the upper surface of the first insulating substrate 110. The first conductive layer 130 includes the first upper conductive layer 131 and the second upper conductive layer 132. The first upper conductive layer 131 and the second upper conductive layer 132 are electrically insulated from each other. For example, as shown in FIG. 2B, the first upper conductive layer 131 and the second upper conductive layer 132 may be formed to be spaced apart from each other by a specific distance and a material constituting the housing of the light source unit 200 may be filled therebetween to be electrically insulated.

The first upper conductive layer 131 and the second upper conductive layer 132 are electrically connected to the first electrode pad and the second electrode pad of the light source unit 200, respectively. The first upper conductive layer 131 and the second upper conductive layer 132 are formed using a conductive material. For example, the first upper conductive layer 131 and the second upper conductive layer 132 may be formed by a single layer or a laminated layer of Au, Pt, Pd, Rh, Ni, W, Mo, Cr, Ti, Fe, Cu, Al, Ag, or an alloy thereof.

Meanwhile, as shown in FIG. 2A, a portion of the first upper conductive layer 131 and the second upper conductive layer 132 may be exposed to the outside. However, this is merely exemplary, and depending on the manufacturing process, the portion of any one of the conductive layer of the first upper conductive layer 131, or the second upper conductive layer 132 may be exposed to the outside. Alternatively, the first upper conductive layer 131 and the second upper conductive layer 132 may not be exposed to the outside.

In FIGS. 2A and 2C, the second conductive layer 140 is formed on the lower surface of the first insulating substrate 110. The second conductive layer 140 includes the first intermediate conductive layer 141, the second intermediate conductive layer 142, and the intermediate dummy layer 143. The first intermediate conductive layer 141, the second intermediate conductive layer 142, and the intermediate dummy layer 143 are electrically insulated from one another. For example, as illustrated in FIGS. 2A and 2C, the first intermediate conductive layer 141, the second intermediate conductive layer 142, and the intermediate dummy layer 143 are formed to be spaced apart from each other by a specific distance and an adhesive material constituting the adhesive layer 180 may be filled therebetween to electrically insulate one another.

The first intermediate conductive layer 141, the second intermediate conductive layer 142, and the intermediate dummy layer 143 may each be formed using a conductive material. For example, similar to the first upper conductive layer 131 and/or the second upper conductive layer 132 described above, the first intermediate conductive layer 141, the intermediate dummy layer 143, and the second intermediate conductive layer 142 may be formed by a single layer or a laminated layer of Au, Pt, Pd, Rh, Ni, W, Mo, Cr, Ti, Fe, Cu, Al, Ag, or an alloy thereof, respectively.

Meanwhile, as shown, the portion of the first intermediate conductive layer 141 and the second intermediate conductive layer 142 may be exposed to the outside. However, this is exemplary and at least one of the first intermediate conductive layer 141, the second intermediate conductive layer 142, and/or the intermediate dummy layer 143 may be exposed to the outside depending on the manufacturing process or the first intermediate conductive layer 141, the second intermediate conductive layer 142, and the intermediate dummy layer 143 may not be exposed to the outside.

FIGS. 2A and 2D, the adhesive layer 180 is disposed between the first insulating substrate 110 and the second insulating substrate 120. The adhesive layer 180 is used to physically couple the first insulating substrate 110 and the second insulating substrate 120. For example, the first conductive layer 130 and the second conductive layer 140 may be formed on the upper and lower surfaces of the first insulating substrate 110, respectively, the third conductive layer 150 may be formed on the lower surface of the second insulating substrate 120, and then the first insulating substrate 110 and the second insulating substrate 120 may be physically coupled by the adhesive layer 180.

A portion of the second insulating substrate 120 is removed to form the plurality of solder holes 171 to 173. For example, as illustrated, the first solder hole 171, the second solder hole 172, and the dummy solder hole 173, each which has a semicircular shape, may be formed in the second insulating substrate 120.

The third conductive layer 150 is formed on the lower surface of the second insulating substrate 120. The third conductive layer 150 includes the first lower conductive layer 151, the second lower conductive layer 152, and the lower dummy layer 153. The first lower conductive layer 151, the second lower conductive layer 152, and the lower dummy layer 153 correspond to the first solder hole 171, the second solder hole 172, and the dummy solder hole 173, respectively, and are formed to each have an opening having the same semicircular shape as the corresponding solder hole.

The first lower conductive layer 151, the second lower conductive layer 152 and the lower dummy layer 153 may each be formed using a conductive material, for example, It may be formed by a single layer or a laminated layer of Au, Pt, Pd, Rh, Ni, W, Mo, Cr, Ti, Fe, Cu, Al, Ag, or an alloy thereof.

FIGS. 2A and 2E, the first upper conductive layer 131, the first intermediate conductive layer 141, and the first lower conductive layer 151 are electrically connected to one another. For example, as shown, a portion of the first and second insulating substrates 110 and 120 may be removed to provide a first via hole and the first upper conductive layer 131, the first intermediate conductive layer 141, and the first lower conductive layer 151 may be electrically connected to one another through a first contact part 161 disposed in the first via hole. In this case, the first upper conductive layer 131, the first intermediate conductive layer 141, the first lower conductive layer 151, and the first contact part 161 penetrating them may be referred to as the first lead terminal 191.

In order to form the first lead terminal 191, the first upper conductive layer 131, the first intermediate conductive layer 141, and the first lower conductive layer 151 may be disposed at a position, where they are considerably overlapped, in plan view. However, this is merely exemplary, and the location is not particularly limited as long as a current path may be formed between the first upper conductive layer 131, the first intermediate conductive layer 141, and the first lower conductive layer 151.

For example, a contact part of the first insulating substrate 110 electrically connecting the first upper conductive layer 131 to the first intermediate conductive layer 141 and a contact part connecting the first intermediate conductive layer 141 to the lower conductive layers 151 may be different from each other, and in this case, the contact parts may be disposed at positions not overlapping each other when viewed in plan view. In addition, in this case, the first upper conductive layer 131 may be disposed at a position partially overlapping with the first intermediate conductive layer 141 in plan view but not overlapping with the first lower conductive layer 151.

Similarly, the second upper conductive layer 132, the second intermediate conductive layer 142, and the second lower conductive layer 152 are electrically connected to one another. For example, the first and second insulating substrates 110 and 120 may be partially removed to provide a second via hole and the second upper conductive layer 132, the second intermediate conductive layer 142, and the second lower conductive layer 152 may be electrically connected to one another through a second contact part 162 disposed in the second via hole.

In this case, the second upper conductive layer 132, the second intermediate conductive layer 142, and the second lower conductive layer 152 may be disposed at a position, where they are considerably overlapped, in plan view, and the second upper conductive layer 132, the second intermediate conductive layer 142, the second lower conductive layer 152, and the second contact part 162 penetrating them may be referred to as the second lead terminal 192.

In embodiments according to the spirit of the present disclosure, the first lead terminal 191 and the second lead terminal 192 include the first intermediate conductive layer 141 and the second intermediate conductive layer 142 disposed between the first insulating substrate 110 and the second insulating substrate 120, respectively. Therefore, the heat generated in the light emitting diode 10 may be widely dispersed into the first intermediate conductive layer 141 and the second intermediate conductive layer 142. In addition, the first intermediate conductive layer 141 and the second intermediate conductive layer 142 may be partially exposed to the outside as shown, and because the exposed surface is in contact with a substrate 300 (see FIG. 5C), the heat path through which the heat generated at the light emitting diode 10 is radiated to the outside may be disposed. Accordingly, the light emitting diode 10 according to the embodiment of the present disclosure may provide the improved heat dissipation performance.

Then, referring to FIGS. 2A and 2E, the intermediate dummy layer 143 is disposed between the first intermediate conductive layer 141 and the second intermediate conductive layer 142. The lower dummy layer 153 is disposed between the first lower conductive layer 151 and the second lower conductive layer 152. The intermediate dummy layer 143 and the lower dummy layer 153 are disposed at a position, where they are considerably overlapped, in plan view, and a bottom surface of the intermediate dummy layer 143 and an inner side of the lower dummy layer 153 are exposed by the dummy solder hole 173. In manufacturing the light emitting diode module, the bottom surface of the intermediate dummy layer 143 and the inner surface of the lower dummy layer 153 which are exposed may be electrically connected to a metal plate disposed on the substrate through solder paste.

The intermediate dummy layer 143, the lower dummy layer 153, and the solder paste connecting the intermediate dummy layer 143 to the lower dummy layer 153 may be referred to as the dummy terminal 193 (see FIG. 5D). The dummy terminal 193 may be electrically insulated from the first lead terminal 191 and the second lead terminal 192, and may effectively dissipate the heat generated inside the light emitting diode 10 to the substrate 300 (see FIG. 5D). At the same time, the dummy terminal 193 serves to provide an adhesive surface of the solder paste which allows the light emitting diode 10 to be firmly fixed to the substrate 300 when the light emitting diode module is manufactured. Therefore, the light emitting diode 10 according to the embodiment of the present disclosure may provide further the improved heat dissipation performance.

Figure 3A:
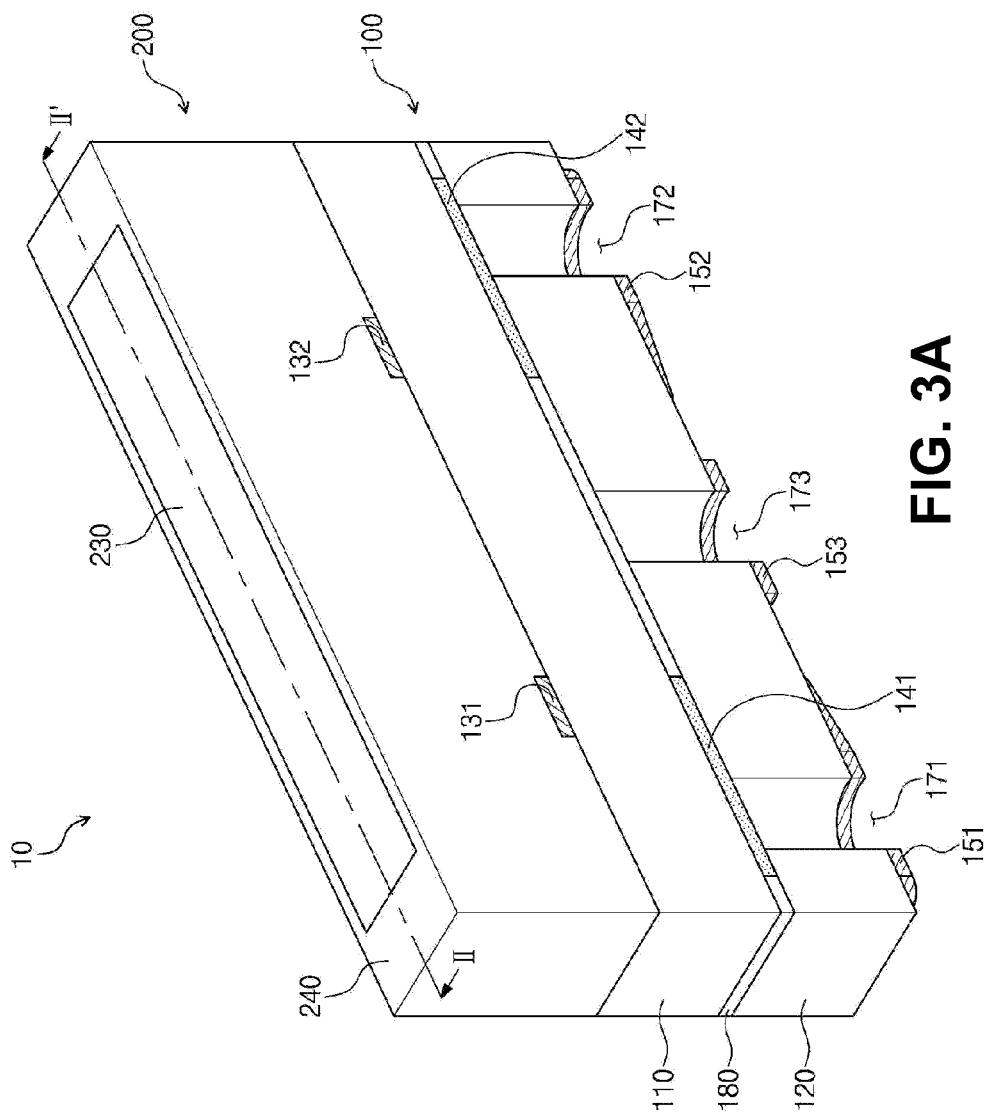
FIGS. 3A through 3F are views explaining a light source unit of FIG. 1 in more detail, where

FIGS. 3A to 3E illustrate the light source unit 200 of FIG. 1. Specifically, FIG. 3A is a perspective view of the light emitting diode unit 10 according to an embodiment of the present disclosure and FIGS. 3B to 3F illustrate cross-sectional views of the light source unit 200 taken along a line II-II' of FIG. 3A.

Figure 3B:
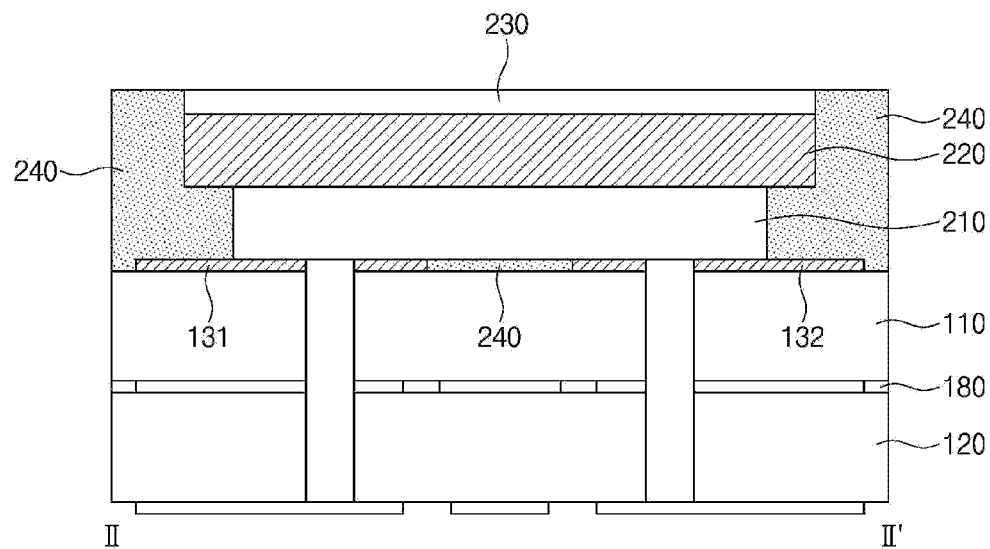

First, referring to FIGS. 3A and 3B, the light source unit 200 includes the light emitting diode chip 210, a wavelength converter 220, the transparent part 230, and the housing 240.

The light emitting diode chip 210 is mounted on the first upper conductive layer 131 and the second upper conductive layer 132, as shown in FIGS. 3B-3F. The light emitting diode chip 210 is mounted in the form of a flip chip, the first electrode pad of the light emitting diode chip 210 is mounted on the first upper conductive layer 131, and the second electrode pad is formed on the second upper conductive layer 132. The structure of the light emitting diode chip 210 will be described in more detail with reference to FIGS. 4A to 4D below.

The wavelength converter 220 may be formed by coating a resin containing a phosphor on a light emitting diode chip using a printing technique, or by coating a phosphor powder using an aerosol injection device or a spray device. For example, using an aerosol deposition method or a spray method, it is possible to form a phosphor thin film of a uniform thickness on the light emitting diode chip, thereby improving color uniformity of the light emitted from the light emitting diode chip. In another embodiment, the wavelength converter 220 may be formed on a chip using a phosphor film.

When the wavelength converter 220 includes a phosphor, at least some of the light finally emitted from the light emitting diode package may have a wavelength band different from a wavelength band of the light emitted from the light emitting diode chip. In other words, the light emitting diode chip may emit light having a first wavelength and the phosphor may emit light having a second wavelength longer than the first wavelength after absorbing light having the first wavelength. For example, the light emitting diode chip may emit ultraviolet light or blue light and the phosphor absorbs ultraviolet light or blue light, and then may emit light of a different wavelength, which has a longer wavelength than the ultraviolet or blue light, for example, green light or red light.

The transparent part 230 is formed on the upper surface of the wavelength converter 220 to protect the wavelength converter 220. For example, the transparent part 230 may be formed using transparent silicon and may block moisture from penetrating into the wavelength converter 220.

The housing 240 may surround the light emitting diode chip 210 to protect the light emitting diode chip 210. For example, in plan view, the housing 240 may be formed to partially overlap the transparent part 230 and the wavelength converter 220.

The housing 240 may be formed of, for example, various insulating materials. Examples of the insulating material may include organic polymers and may be a silicone resin or epoxy resin.

The housing 240 may also be made of a sealing member. The sealing member is a member having a function of sealing (covering) a part of the light emitting diode chip 210 or fixing the light emitting diode chip 210 to the lead frame unit 100. The material of the sealing member is not particularly limited and may be ceramic, resin, dielectric, pulp, glass, or a composite material thereof. Especially, resin is preferable in that resin is capable being easily molded into any shape.

Examples of the resin include a thermosetting resin, a thermoplastic resin, a modified resin thereof, or a hybrid resin containing one or more of these resins. Specifically, the resin may be an epoxy resin composition, a modified epoxy resin composition (such as a silicone-modified epoxy resin), a silicone resin composition, a modified silicone resin composition (such as an epoxy-modified silicone resin), a hybrid silicone resin, a polyimide resin composition, a modified polyimide resin composition, a polyamide resin, a polyethylene terephthalate resin, a polybutylene terephthalate resin, a polycyclohexane terephthalate resin, polyphthalamide (PPA), a polycarbonate resin, polyphenylene sulfide (PPS), liquid crystal polymer (LCP), an ABS resin, a phenol resin, an acrylic resin, a PBT resin, an urea resin, a BT resin, and a polyurethane resin.

In embodiments according to the present disclosure, the housing 240 may fill a space between the first upper conductive layer 131 and the second upper conductive layer 132. When an air layer exists between the first upper conductive layer 131 and the second upper conductive layer 132, the air layer may flow by the heat generated by the light emitting diode chip 210, which results in weakening of adhesive strength between the light emitting diode chip 210 and the first and second upper conductive layers 131 and 132. The light emitting diode 10 according to the exemplary embodiment of the present disclosure may fill the space between the first upper conductive layer 131 and the second upper conductive layer 132 using the housing 240, and thus, air flow by the air layer between the first upper conductive layer 131 and the second upper conductive layer 132 may be blocked in advance.

Meanwhile, the above description is by way of example, and the structure of the light source unit 200 may be variously modified and applied depending on the designer. Hereinafter, modified embodiments of the light source unit 200 will be described in more detail.

Figure 3C:
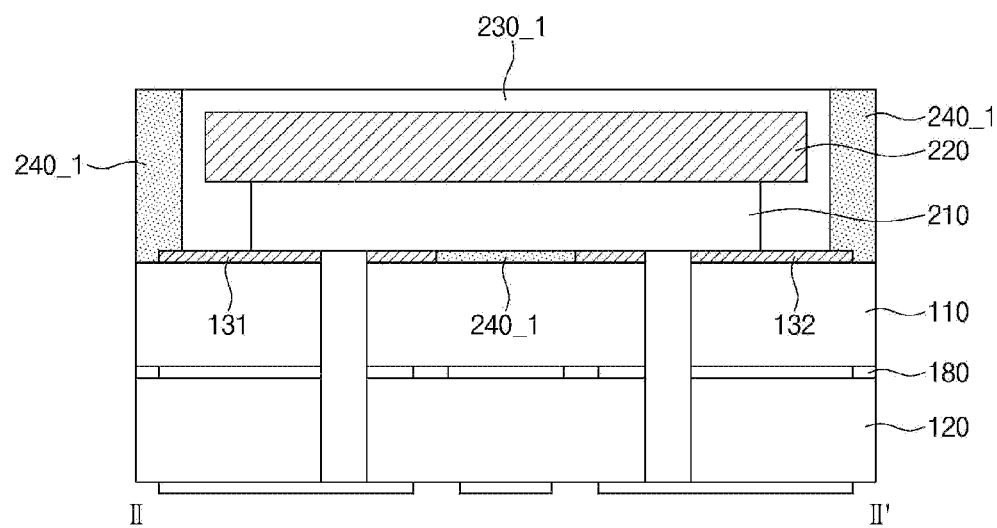

Referring to FIGS. 3A and 3C, the wavelength converter 220 may be disposed on the upper surface of the light emitting diode chip 210 and a transparent part 230_1 may be formed to surround front and side surfaces of a wavelength converter 220 and the side surface of the light emitting diode chip 210. In addition, a housing 240_1 may be formed to surround the side surface of the transparent part 230_1.

In this case, the transparent part 230_1 may be in contact with the first upper conductive layer 131 and the second upper conductive layer 132. In addition, in plan view, both ends of the transparent part 230_1 in the longitudinal direction may be disposed between opposing walls of the housing 240_1.

Figure 3D:
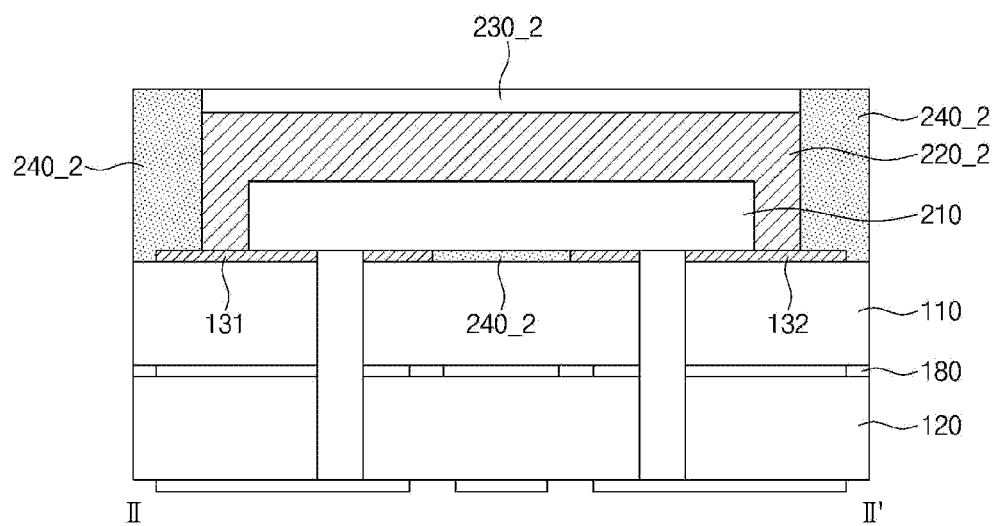

Referring to FIGS. 3A and 3D, a wavelength converter 220_2 may be formed to surround the front and side surfaces of the light emitting diode chip 210. Furthermore, a transparent part 230_2 may be disposed on an upper surface of the wavelength converter 220_2 and a housing 240_2 may be formed to surround side surfaces of the wavelength converter 220_2 and the transparent part 230_2. In this case, the wavelength converter 220_2 may be in contact with the first upper conductive layer 131 and the second upper conductive layer 132.

Figure 3E:
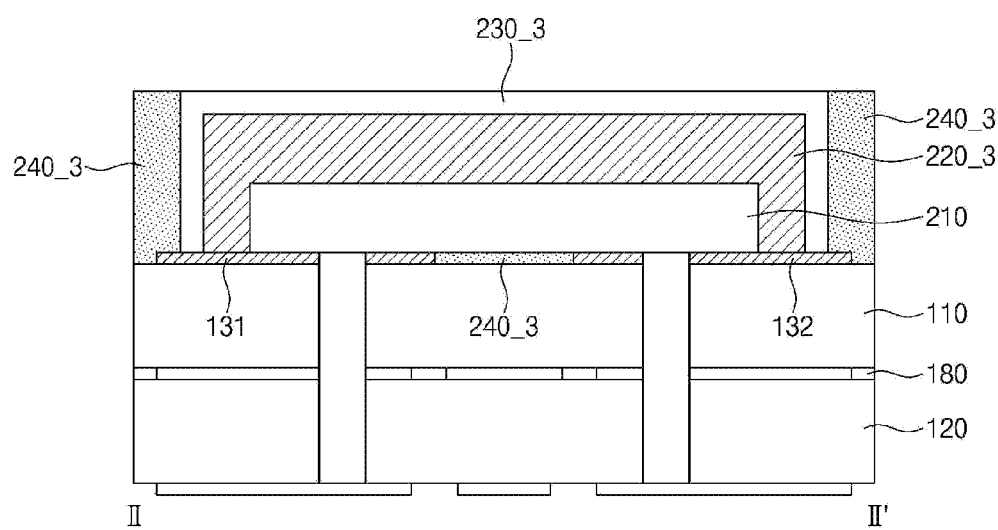

Referring to FIGS. 3A and 3E, a wavelength converter 220_3 may surround the front and side surfaces of the light emitting diode chip 210, and a transparent part 230_3 may surround front and side surfaces of the wavelength converter 220_3. In addition, a housing 240_3 may be formed to surround the side surface of the transparent part 2303. In this case, the wavelength converter 220_3 and the transparent part 230_3 may be in contact with the first upper conductive layer 131 and the second upper conductive layer 132, respectively.

Figure 3F:
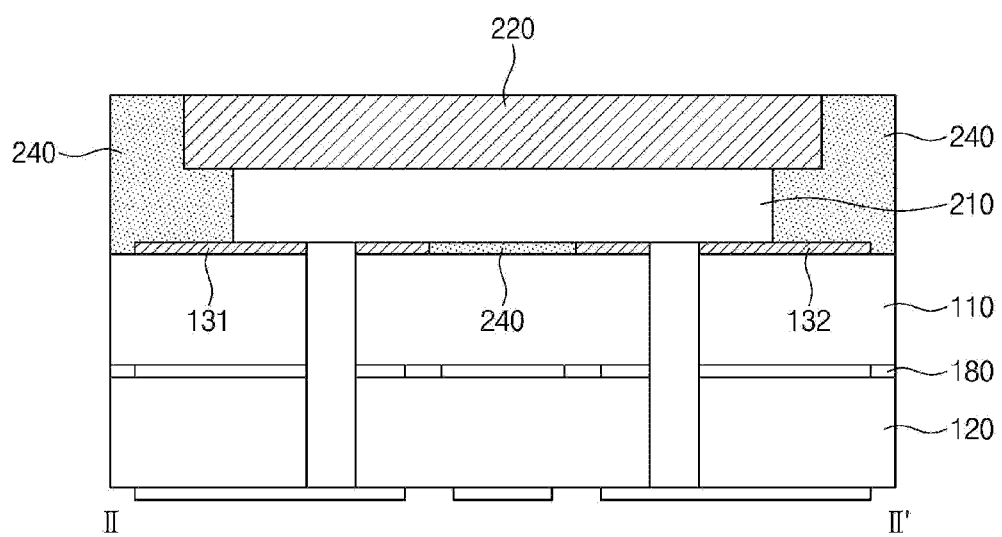

Meanwhile, the above description is illustrative, and it will be understood that the technical spirit of the present disclosure is not limited thereto. For example, as illustrated in FIG. 3F, the light source unit 200 may be implemented not to include a transparent part. The structure of the light source unit 200 without the transparent part is similar to that of FIGS. 3B to 3E and a detailed description thereof will be omitted for simplicity.

Figure 4A:
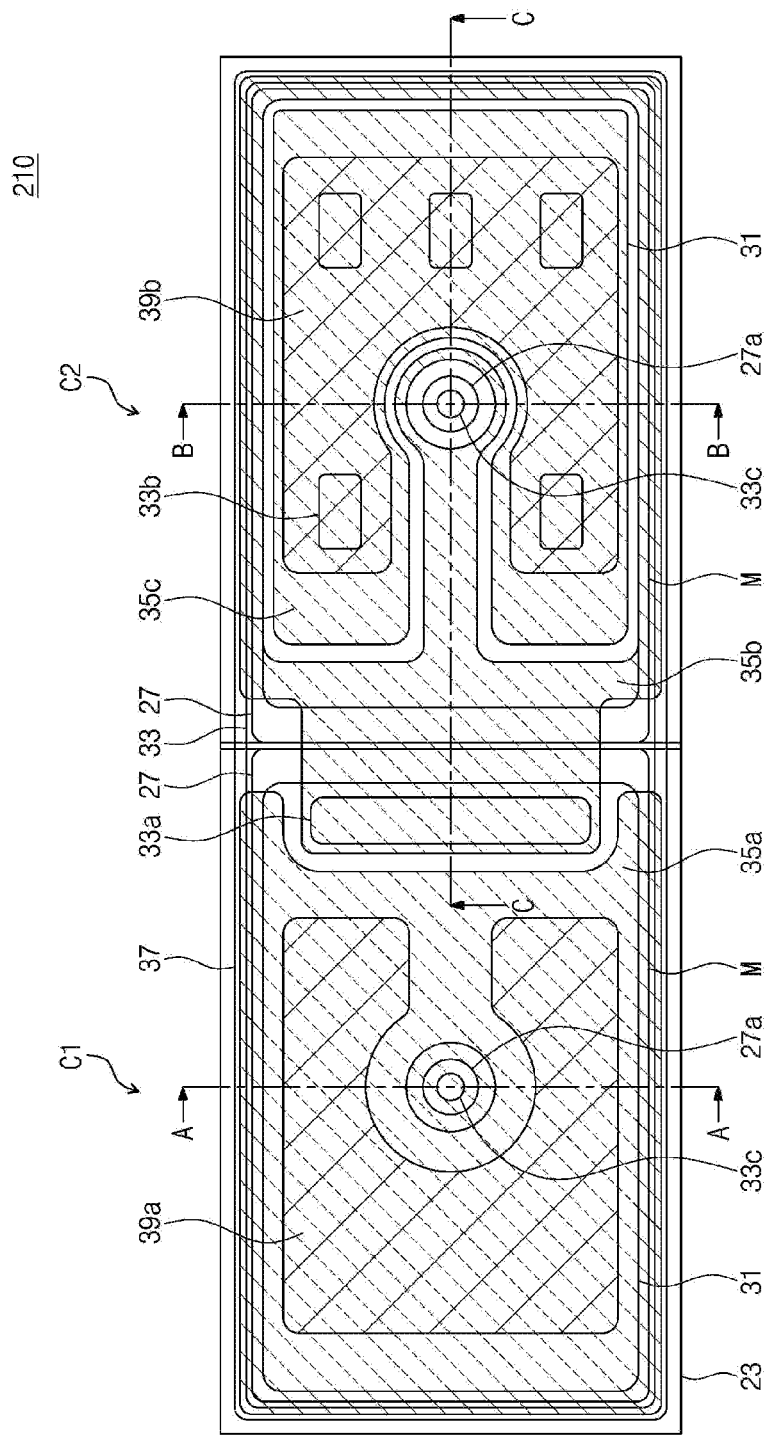
FIGS. 4A through 4D are views explaining a light emitting diode chip of a light source unit in more detail, where
Figure 4B:
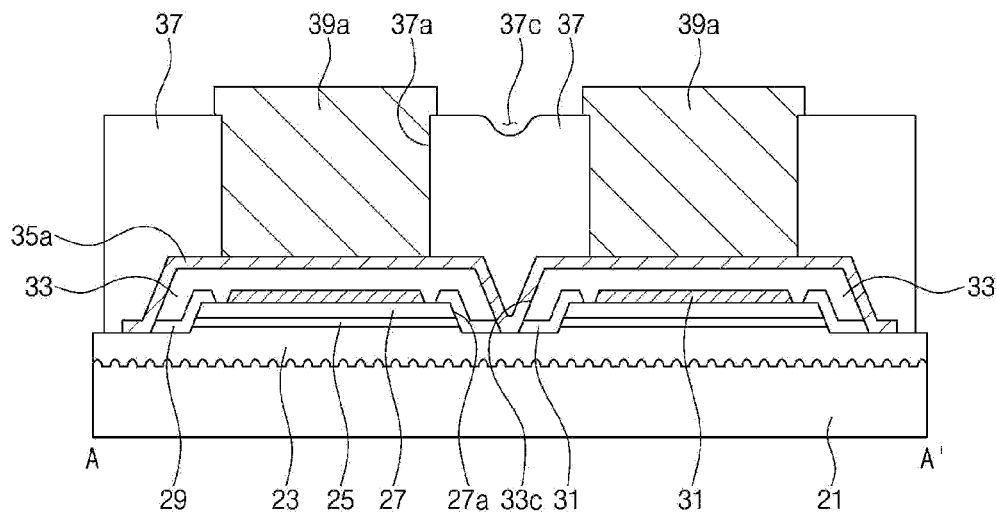
Figure 4C:
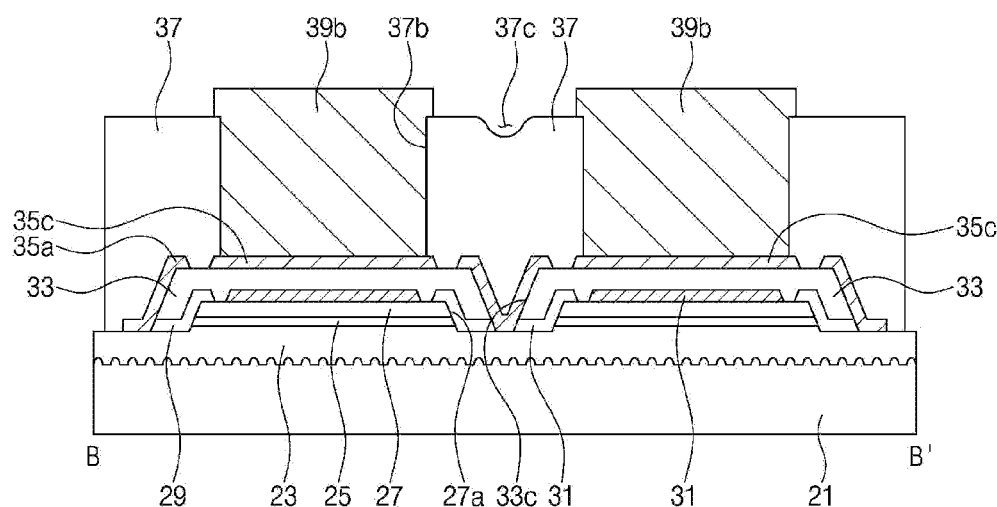
Figure 4D:
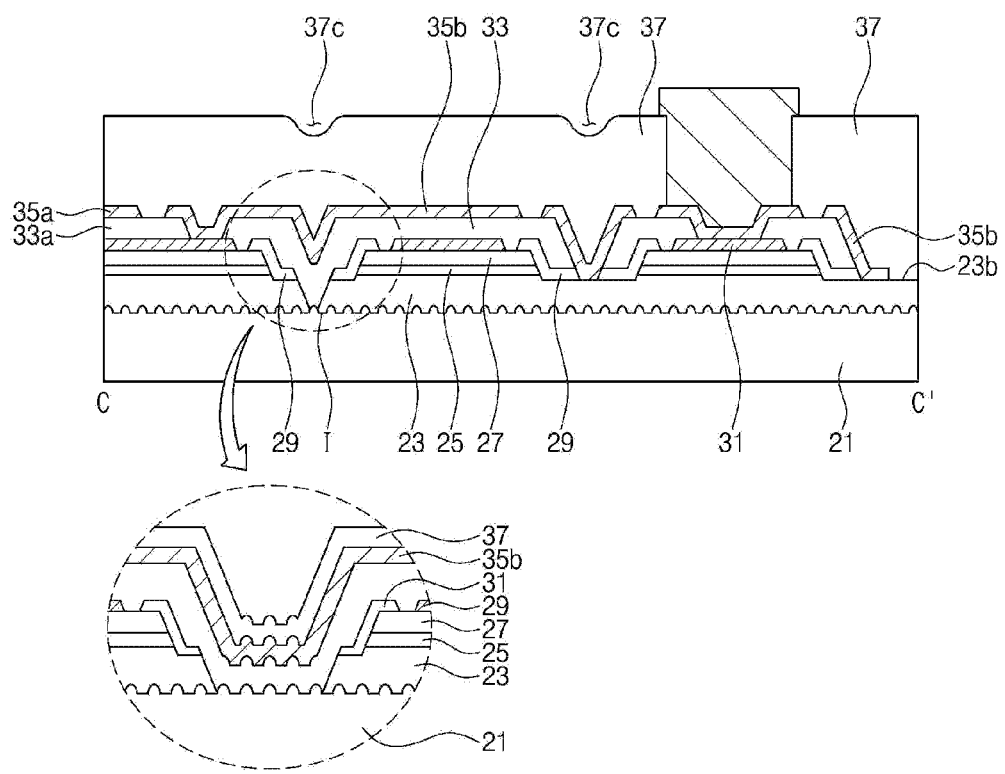

FIGS. 4A to 4D illustrate the light emitting diode chip 210 of the light source unit 200 in more detail. FIG. 4A is a schematic plan view of the light emitting diode chip 210 according to an embodiment of the present invention. FIGS. 4B, 4C, and 4D illustrate schematic cross-sectional views taken along lines A-A, B-B, and C-C of FIG. 4A, respectively.

Referring to FIGS. 4A to 4D, the light emitting diode chip 210 includes a substrate 21, a first light emitting cell C1, a second light emitting cell C2, a reflective structure 31, first, second and third contact layers 35a, 35b, and 35c, a first electrode pad 39a, and a second electrode pad 39b. The light emitting diode chip 210 may also include a preliminary insulating layer 29, a lower insulating layer 33, and a resin layer 37. In addition, the first and second light emitting cells C1 and C2 each includes an n-type semiconductor layer 23, an active layer 25, and a p-type semiconductor layer 27. Here, although the light emitting diode chip is described as having a series multi-junction structure, this is relevant to an example, and of course, it may be disposed in another form in another embodiment of the present invention.

The substrate 21 may be a growth substrate for growing an III-V nitride semiconductor layer and may be, for example, a sapphire substrate, particularly a patterned sapphire substrate. The substrate 21 is preferably an insulating substrate, but is not limited to the insulating substrate. However, when the light emitting cells arranged on the substrate 21 are connected to each other in series, the substrate 21 should be insulated from the light emitting cells. Therefore, when the substrate 21 is insulative, or the substrate 21 is conductive, an insulating material layer may be disposed between the light emitting cells C1 and C2 and the substrate 21 to insulate the light emitting cells C1 and C2 from the substrate 21. The substrate 21 may have a rectangular exterior as shown in FIG. 4A. A side surface of the substrate 21 may be formed by laser scribing and cracking using the same. In addition, the substrate 21 may be removed from the light emitting cells C1 and C2 using appropriate techniques such as laser lift off, chemical lift off, grinding, or the like.

The first and second light emitting cells C1 and C2 are disposed on the substrate 21. The first and second light emitting cells C1 and C2 are separated from each other by an isolation region "I" exposing the substrate 21, for example, as shown in FIG. 4D. Here, the isolation region "I" refers to a region for separating the light emitting cells C1 and C2 from each other and is distinguished from a scribing or dicing region separating the substrate 21. Semiconductor layers of the first light emitting cell C1 and the second light emitting cell C2 are spaced apart from each other by the isolation region "I". The first and second light emitting cells C1 and C2 may be disposed to face each other and may each have a square or rectangular shape. In particular, the first and second light emitting cells C1 and C2 may each have an elongated rectangular shape in a direction facing each other.

The first and second light emitting cells C1 and C2 each include the n-type semiconductor layer 23, the active layer 25, and the p-type semiconductor layer 27. The n-type semiconductor layer 23, the active layer 25, and the p-type semiconductor layer 27 may be formed of a III-V-based nitride semiconductor, for example, a nitride semiconductor such as (Al, Ga, In)N. The n-type semiconductor layer 23, the active layer 25, and the p-type semiconductor layer 27 may be grown and formed on the substrate 21 in a chamber using a known method such as metal organic chemical vapor deposition (MOCVD). In addition, the n-type semiconductor layer 23 includes n-type impurities (e.g., Si, Ge, Sn), and the p-type semiconductor layer 27 includes p-type impurities (e.g., Mg, Sr, Ba). For example, in an embodiment, the n-type semiconductor layer 23 may include GaN or AlGaN containing Si as dopants and the p-type semiconductor layer 27 may include GaN or AlGaN containing Mg as dopants. Although the n-type semiconductor layer 23 and the p-type semiconductor layer 27 are each shown as a single layer in the drawing, these layers may be multiple layers and may also include a superlattice layer. The active layer 25 may include a single quantum well structure or a multi-quantum well structure and adjust a composition ratio of a nitride-based semiconductor thereof to emit a desired wavelength. For example, the active layer 25 may emit blue light or ultraviolet light.

The isolation region "I" separates the light emitting cells C1 and C2 from each other. The substrate 21 is exposed through semiconductor layers in the isolation region "I". The isolation region "I" may be formed using a photolithography and an etching process and at this time, a photoresist pattern having a gentle slope may be formed by reflowing photoresist using a high temperature baking process and the semiconductor layers are etched using the photoresist as a mask, which results in forming the isolation region "I" having relatively gently sloped sides. Furthermore, as shown in FIG. 4D, a stepped inclined surface may be formed in the isolation region "I". After a mesa forming process in which the n-type semiconductor layer 23 is exposed is first performed, the isolation region "I" exposing the substrate 21 may be formed to form the stepped inclined surface in the isolation region "I".

While the isolation region "I" is interposed between the light emitting cells C1 and C2, the light emitting cells C1 and C2 face each other. The side surfaces of the light emitting cells C1 and C2 facing each other are defined as inner surface. Meanwhile, side surfaces of the light emitting cells other than the inner surface are defined as an outer surface. Therefore, the n-type semiconductor layers 23 in the first and second light emitting cells C1 and C2 also include inner and outer surfaces, respectively.

For example, the n-type semiconductor layer 23 may include one inner surface and three outer surfaces. As shown in FIG. 4D, the outer surfaces of the n-type semiconductor layer 23 may be sharply inclined relative to the inner surface. In the present embodiment, all outer surfaces of the n-type semiconductor layer 23 are described as being inclined sharply compared to the inner surface, but the present invention is not limited thereto, and at least one outer surface is inclined sharply compared to the inner surface. In addition, the opposite outer sides perpendicular to the isolation region "I" may be inclined relatively sharply and the outer surface parallel to the isolation region "I" may be gently inclined in the same manner as the isolation region "I".

Further, the relatively sharply inclined outer surfaces may be parallel to the side of the substrate 21. For example, the outer surfaces of the n-type semiconductor layers 23 may be formed by scribing the n-type semiconductor layer 23 together with the substrate 21, and thus may be formed together with the sides of the substrate 21.

A mesa "M" is disposed on each n-type semiconductor layer 23. The mesa "M" may be limitedly disposed inside a region surrounded by the n-type semiconductor layer 23, and thus, regions near edges adjacent to the outer surfaces of the n-type semiconductor layer 23 are not covered by the mesa "M" and are exposed to the outside. In addition, on sidewall of the isolation region "I", the side surface of the mesa "M" and the side surface of the n-type semiconductor layer 23 are discontinuous with each other, and thus, the stepped slope may be formed as described previously.

The mesa "M" includes the p-type semiconductor layer 27 and the active layer 25. The active layer 25 is interposed between the n-type semiconductor layer 23 and the p-type semiconductor layer 27. In the drawings, the inner surface of the mesa "M" is shown to be inclined the same as the outer surfaces, but the present invention is not limited thereto, and the inner surface of the mesa "M" may be gentler than the outer surfaces. Therefore, stability of a second contact layer 35b described later may be improved further.

The mesa "M" may have a through hole 27a penetrating through the p-type semiconductor layer 27 and the active layer 25. Although a plurality of through holes may be formed in the mesa "M", as illustrated in FIG. 4A, the single through hole 27a may be formed. In this case, each through hole 27a may have a circular shape near a center of the mesa "M", but is not limited thereto, and may have an elongated shape passing through the center of the mesa "M".

The reflective structure 31 is disposed on each of the p-type semiconductor layers 27 of the first and second light emitting cells C1 and C2, respectively. The reflective structure 31 is in contact with the p-type semiconductor layer 27. The reflective structure 31 may have an opening which exposes the through hole 27a and may be disposed in almost the entire area of the mesa "M" in the mesa "M" upper region. For example, the reflective structure 31 may cover 80% or more, and even 90% or more of the mesa "M" upper region.

The reflective structure 31 may include a reflective metal layer, and thus may reflect light, which is generated in the active layer 25 and travels to the reflective structure 31 toward the substrate 21. For example, the reflective metal layer may include Ag or Al. In addition, a Ni layer may be formed between the reflective metal layer and the p-type semiconductor layer 27 to help the reflective structure 31 to be in ohmic contact with the p-type semiconductor layer 27. Alternatively, the reflective structure 31 may include a transparent oxide layer such as, for example, indium tin oxide (ITO) or ZnO.

Meanwhile, the preliminary insulating layer 29 may cover the mesa "M" around the reflective structure 31. The preliminary insulating layer 29 may be formed of SiO2 using, for example, a chemical vapor deposition technique and may cover the side of the mesa "M" and further cover a portion of the n-type semiconductor layer 23. As shown in FIG. 4D, the preliminary insulating layer 29 may be removed from the lower inclined surface and remain on the upper inclined surface and stepped part of the steeped slop of the isolation region "I".

The lower insulating layer 33 covers the mesas "M" and covers the reflective structure 31 and the preliminary insulating layer 29. The lower insulating layer 33 also covers the sidewalls of the isolation region "I" and the mesa "M" and partially covers the n-type semiconductor layer 23 around the mesa "M". As shown in the enlarged cross-sectional view of FIG. 4D, when the substrate 21 is a patterned sapphire substrate, the lower insulating layer 33 may be formed corresponding to a shape of protrusions on the substrate 21 in the isolation region "I".

The lower insulating layer 33 is disposed between the first, second and third contact layers 35a, 35b, and 35c and the first and second light emitting cells C1 and C2. The first, second and third contact layers 35a, 35b, and 35c provide a passage through which the n-type semiconductor layer 23 or the reflective structure 31 is capable of being connected. For example, the lower insulating layer 33 may include a hole 33a exposing the reflective structure 31 on the first light emitting cell C1, a hole 33b exposing the reflective structure 31 on the second light emitting cell, and an opening 33c exposing the n-type semiconductor layer 23 in the through hole 27a. In addition, the lower insulating layer 33 covers around the mesa "M" and exposes the regions near the edge of the n-type semiconductor layer 23.

As shown in FIG. 4A, the hole 33a may have an elongated shape parallel to the isolation region "I", and is disposed closer to the isolation region "I" than the through hole 27a. Therefore, a current may be injected into the reflective structure 31 on the first light emitting cell C1 in a wide area. Although the single hole 33a is described as exposing the reflective structure 31 on the first light emitting cell C1 in the present embodiment, a plurality of holes 33a may be disposed.

Meanwhile, the hole 33b is disposed on the second light emitting cell C2, as shown in FIG. 4a, a plurality of holes 33b may be disposed. Although five holes 33b are shown in the present embodiment, the present invention is not limited thereto, and more or less than five holes 33b may be disposed. The center of the entirety of the holes 33b is located farther than the center of the mesa "M" from the isolation region "I". Accordingly, the current may be prevented from being concentrated near the isolation region "I"

and the current may be dispersed in the wide area of the second light emitting cell C2.

The opening 33c exposes the n-type semiconductor layer 23 in the through hole 27a to provide a path through which the first contact layer 35a and the second contact layer 35b are connected to the n-type semiconductor layer 23.

The lower insulating layer 33 may be formed of an insulating material such as SiO2 or Si3N4, and may be formed of a single layer, or multiple layers. Further, the lower insulating layer 33 may include a distributed Bragg reflector, which is formed by repeatedly stacking material layers having different refractive indices, for example, SiO2/TiO2. When the lower insulating layer 33 includes the distributed Bragg reflector, light incident to a region other than the reflective structure 31 may be reflected to further improve light extraction efficiency.

The first contact layer 35a is disposed on the first light emitting cell "C1" to be in ohmic contact with the n-type semiconductor layer 23. The first contact layer 35a may be in ohmic contact with the n-type semiconductor layer 23 in a region between the outer surface of the n-type semiconductor layer 23 and the mesa "M" along the mesa "M" circumference. In addition, the first contact layer 35a may be in ohmic contact with the n-type semiconductor layer 23 exposed by the opening 33c of the lower insulating layer 33 in the through hole 27a of the mesa "M". Furthermore, the first contact layer 35a may cover the upper portion and side of the mesa "M" except for a partial region around the hole 33a.

The second contact layer 35b is in ohmic contact with the n-type semiconductor layer 23 of the second light emitting cell C2 and is connected to the reflective structure 31 of the first light emitting cell C1. Therefore, the second contact layer 35b electrically connects the p-type semiconductor layer 27 of the first light emitting cell C1 and the n-type semiconductor layer 23 of the second light emitting cell C2.

The second contact layer 35b may be in ohmic contact with the n-type semiconductor layer 23 in a region between the outer surface of the n-type semiconductor layer 23 and the mesa "M" along the mesa "M" circumference. In addition, the second contact layer 35b may be in ohmic contact with the n-type semiconductor layer 23 exposed by the opening 33c of the lower insulating layer 33 in the through hole 27a of the mesa "M". Further, the second contact layer 35b is connected to the reflective structure 31 exposed in the hole 33a. To this end, the second contact layer 35b extends from the second light emitting cell C2 to the first light emitting cell C1 through the upper portion of the isolation region "I". At this time, the second contact layer 35b passing over the isolation region "I" is limited within a width of the mesa "M", as shown in FIG. 4A. Accordingly, the second contact layer 35b may be prevented from being short-circuited to the n-type semiconductor layer 23 of the first light emitting cell C1. In addition, since the second contact layer 35b is relatively gently inclined and passes through the stepped isolation region "I" to improve process stability. The second contact layer 35b may be disposed on the lower insulating layer 33 on the isolation region "I" and may be formed to have irregularities corresponding to the shape of the lower insulating layer 33.

The third contact layer 35c is disposed on the lower insulating layer 33 on the second light emitting cell C2, as shown in FIG. 4A. The third contact layer 35c is connected to the reflective structure 31 through the holes 33b of the lower insulating layer 33 and electrically connected to the p-type semiconductor layer 27 through the reflective structure 31. The third contact layer 35c may be disposed in an area surrounded by the second contact layer 35b and may have a shape partially surrounding the second through hole 27a. The third contact layer 35c is located at the same level as the first and second contact layers 35a and 35b to help the resin layer 37 and the first and second electrode pads 39a and 39b formed thereon to be easily formed. The third contact layer 35c may be omitted.

In some embodiments, the first, second and third contact layers 35a, 35b, and 35c may be formed by the same process using the same material. In other embodiments, different processes using the same or different materials may be available. The first, second, and third contact layers 35a, 35b, and 35c may include a high reflective metal layer such as an Al layer, and the high reflective metal layer may be formed on an adhesive layer such as Ti, Cr, or Ni. In addition, a protective layer of a single layer or a composite layer structure such as Ni, Cr, Au, or the like may be formed on the high reflective metal layer. The first, second and third contact layers 35a, 35b, and 35c may have, for example, a multilayer structure of Cr/Al/Ni/Ti/Ni/Ti/Au/Ti.

The resin layer 37 is disposed on the first contact layer 35a and the second contact layer 35b, and includes a first via hole 37a exposing the first contact layer 35a and a second via hole 37b exposing the third contact layer 35c. The first and second via holes 37a and 37b are formed in a shape that partially surrounds the first through hole 27a and the second through hole 27b when viewed in plan view. When the third contact layer 35c is omitted, the lower insulating layer 33 and the holes 33b of the lower insulating layer are exposed through the second via hole 37b.

The resin layer 37 may have recesses 37c on the first through hole 27a and the second through hole 27b. The recesses 37c may be formed to correspond to the first through hole 27a and the second through hole 27b.

Furthermore, the resin layer 37 covers the first and second contact layers 35a and 35b connected to the n-type semiconductor layer 23 around the mesa "M". As shown in FIGS. 4B to 4D, the region between the first and second contact layers 35a and 35b, and the edge of the n-type semiconductor layer 23 may be covered with the resin layer 37. Therefore, the first and second contact layers 35a and 35b may be protected from the external environment such as moisture by the resin layer 37. The resin layer 37 may also cover the second contact layer 35b on the isolation region "I" to be formed to have a recess 37d corresponding to the shape of the second contact layer 35b on the isolation region "I."

The resin layer 37 may be formed of a photosensitive resin such as a photoresist, for example, may be formed using a technique such as spin coating. Meanwhile, the first and second via holes 37a and 37b may be formed by exposure and development.

The first electrode pad 39a fills the first via hole 37a of the resin layer 37 and is electrically connected to the first contact layer 35a. In addition, the second electrode pad fills the second via hole 37b and is electrically connected to the third contact layer 35c. When the third contact layer 35c is omitted, the second electrode pad 39b may be directly connected to the reflective structure 31. As shown in FIG. 4A, the first electrode pad 39a and the second electrode pad 39b may partially surround the first through hole 27a and the second through hole 27b, respectively, when viewed in plan view. Thus, the first electrode pad 39a and the second electrode pad 39b partially surround the recesses 37c. The first electrode pad 39a and the second electrode pad 39b may surround more than ½, or more than ⅔, of the circumference of the first through hole 27a and the second through hole 27b. In addition, the first electrode pad 39a and the second electrode pad 39b may protrude above the resin layer 37. Accordingly, deep grooves may be formed in the first and second through holes 27a and 27b, and when the light emitting diode chip 210 is bonded through the grooves using a conductive adhesive such as solder, the solder may be trapped in the grooves to prevent the solder from overflowing to the outside. The first electrode pad 39a and the second electrode pad 39b may be limitedly disposed in the upper region of the mesa "M", respectively.

FIGS. 5A to 5D are views illustrating a light emitting diode module formed using the light emitting diode 10 of FIG. 1. In detail, FIG. 5A illustrates an example of a process of bonding the light emitting diode 10 to the substrate 300 using a solder paste "1". FIG. 5B is a view illustrating an example of a completed light emitting diode module. FIG. 5C is a cross-sectional view taken along a line of A-A' of FIG. 5B. FIG. 5D is a cross-sectional view taken along a line B-B' of FIG. 5B.

First, referring to FIG. 5A, the light emitting diode 10, the substrate 300, and the solder paste "1" for bonding the light emitting diode 10 to the substrate 300 are disposed.

The solder paste "1" is disposed in the first solder hole 171 and the second solder hole 172 of the light emitting diode 10. The first lead terminal 191 is electrically connected to a first electrode 310 on the substrate 300 through the solder paste "1" disposed in the first solder hole 171, and the second lead terminal 192 is electrically connected to a second electrode 320 on the substrate 300 through the solder paste "1" disposed in the second solder hole 172.

In addition, the solder paste "1" is disposed in the dummy solder hole 173 of the light emitting diode 10. The dummy terminal 193 (see FIG. 5D) is electrically connected to a metal plate 330 on the substrate 300 through the solder paste "1" disposed in the dummy solder hole 173.

In embodiments according to the present disclosure, the solder paste "1" is electrically connected to the first intermediate conductive layer 141 exposed to the first solder hole 171 to form the heat path between the first electrode 310 of the substrate 300 and the first intermediate conductive layer 141. In addition, the solder paste "1" is electrically connected to the second intermediate conductive layer 142 exposed to the second solder hole 172, to form a heat path between the second electrode 320 of the substrate 300 and the second intermediate conductive layer 142. Accordingly, the heat dissipation characteristics of the light emitting diode package and the light emitting diode module may be improved.

In addition, the light emitting diode 10 may be attached to the metal plate 330 on the substrate 300 through the solder paste "1" disposed in the dummy solder hole 173 to be more firmly fixed to the substrate. In addition, the solder paste "1" disposed in the dummy solder hole 173 may be electrically connected to form the heat path between the metal plate 330 of the substrate 300 and the intermediate dummy layer 143, thereby further improving the heat dissipation characteristics.

In addition, the solder paste "1" may be inserted into the solder holes 171 to 173 formed inside the lead frame unit 100 and thus, in the light emitting diode module according to the technical idea of the present disclosure, there are advantages that an area occupied by the solder paste "1" is capable of being minimized and miniaturization is possible.

Meanwhile, "solder paste" means a final adhesive layer formed using a paste which is a mixture of metal powder, flux and organics. However, when describing the manufacturing method of the light emitting diode module, "solder paste" may be used to mean a paste that is a mixture of metal powder, flux and organics. For example, the solder paste "1" may contain Sn and another metal. The solder paste "1" may contain at least 50%, at least 60%, or at least 90% of Sn relative to the total metal weight. For example, the solder paste may include a lead-containing solder alloy such as Sn—Pb or Sn—Pb—Ag-based, or a lead-free solder alloy such as Sn—Ag-based alloy, Sn—Bi-based alloy, Sn—Zn-based alloy, Sn—Sb-based or Sn—Ag—Cu alloy.

Referring to FIG. 5B, an example of a light emitting diode module according to an embodiment of the present disclosure is illustrated. As shown, the light emitting diode module may emit light in a direction parallel to the substrate 300, and thus the light emitting diode module may be referred to as a side type light emitting diode module.

Referring to FIG. 5C, the solder paste "1" is disposed in the first solder hole 171. As shown, the solder paste "1" is bonded to the lower surface of the first intermediate conductive layer 141, the inner surface of the second insulating substrate 120, and the inner surface of the first lower conductive layer 151, and thus the light emitting diode 10 is bonded to the substrate 300. In addition, the first intermediate conductive layer 141 is connected to the first electrode 310 through the solder paste "1", to allow the heat of the light emitting diode 10 to be radiated through the first intermediate conductive layer 141 to the substrate 300.

Referring to FIG. 5D, the solder paste "1" is disposed in the first solder hole 171. As shown, the solder paste "1" is bonded to the lower surface of the intermediate dummy layer 143, the inner surface of the second insulating substrate 120, and the inner surface of the lower dummy layer 153, and thus the light emitting diode 10 is bonded to the substrate 300. In addition, the solder paste "1" is electrically connected to the intermediate dummy layer 143 and the lower dummy layer 153 to form the dummy terminal 193, and the heat of the light emitting diode 10 is radiated through the dummy terminal 193 to the substrate 300.

As described with reference to FIGS. 1 to 5, the light emitting diode 10 according to an embodiment of the present disclosure includes the lead frame unit 100 and the light source unit 200 mounted on the lead frame unit 100 and the lead frame unit 100 includes the at least three conductive layers disposed on different layers. In particular, the light emitting diode 10 according to the embodiment of the present disclosure may radiate the heat inside the light emitting diode 10 to the outside through the at least three conductive layers to provide the improved heat dissipation effect.

Meanwhile, the above description is illustrative and it will be understood that the present disclosure is not limited thereto. Within the scope of the technical idea of the present disclosure, various design and structural changes may be made by those skilled in the art. In the following, various modifications falling within the scope of the technical spirit of the present disclosure will be further described.

Figure 6A:
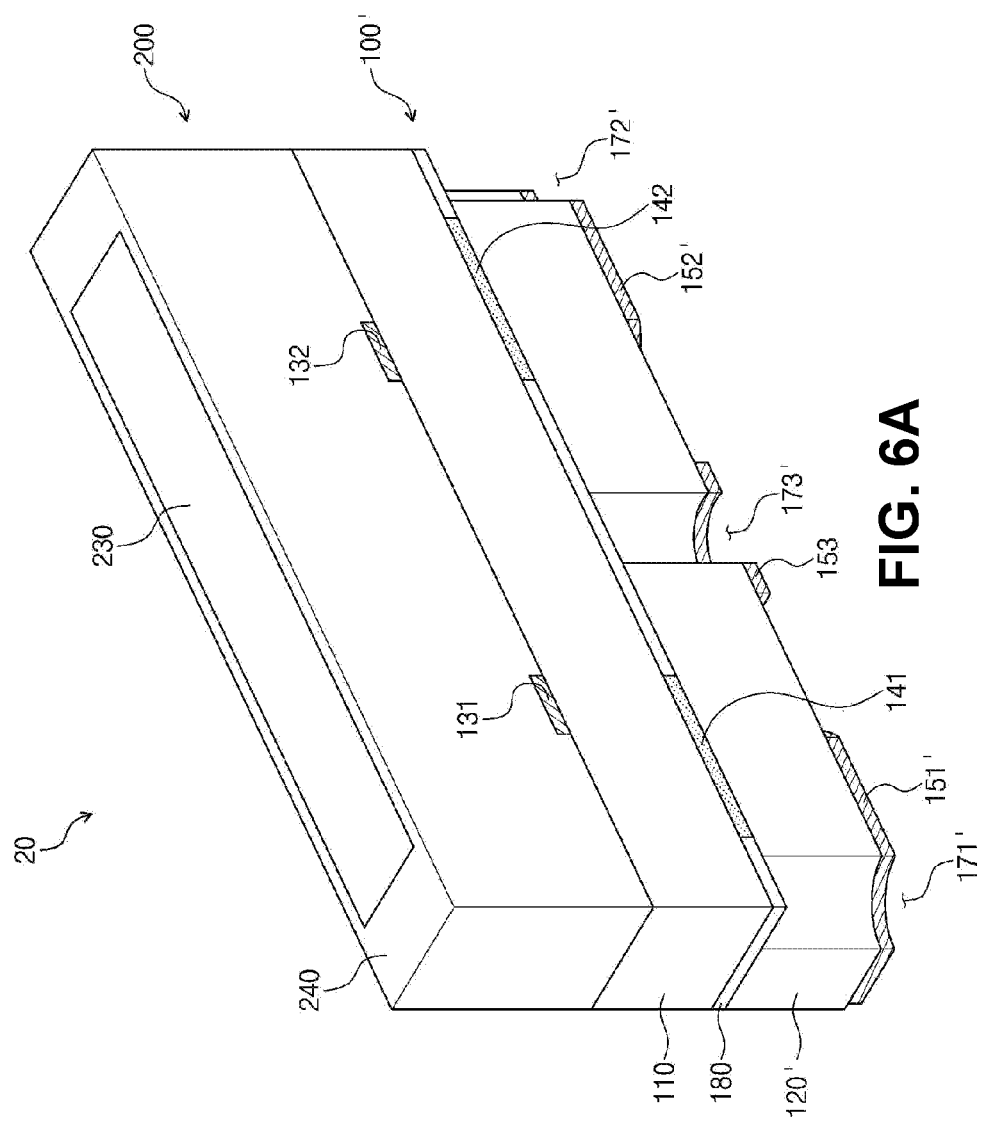
FIGS. 6A through 6D are views illustrating a light emitting diode according to another embodiment of the present disclosure, where
Figure 6B:
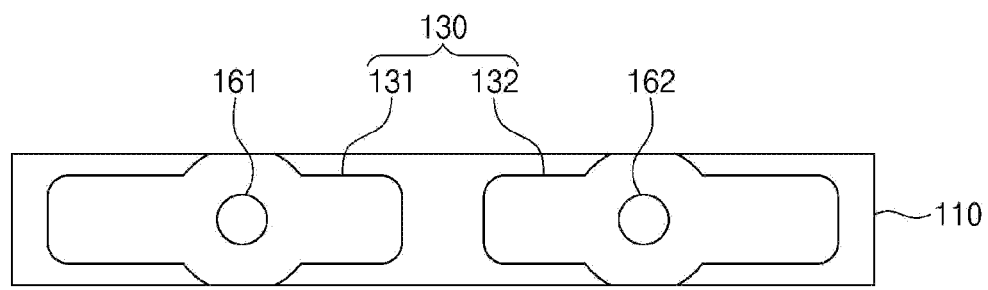
Figure 6C:
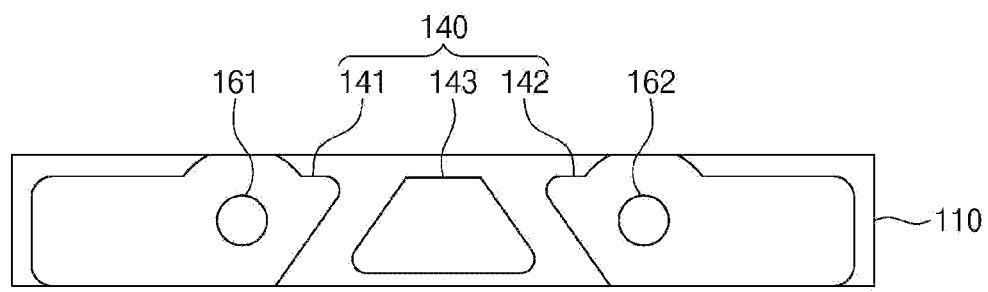
Figure 6D:
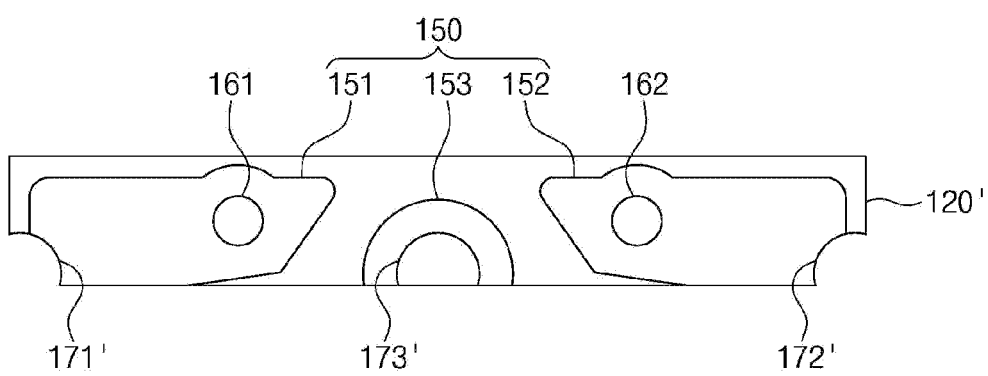

FIGS. 6A to 6D are views illustrating the light emitting diode 10 according to another embodiment of the present disclosure. Specifically, FIG. 6A is a perspective view showing an overall appearance of the light emitting diode 10 according to another embodiment of the present disclosure. FIGS. 6B to 6D are plan views illustrating the first conductive layer 130, the second conductive layer 140, and the third conductive layer 150 included in a lead frame unit 100' of FIG. 6A, respectively.

The light emitting diode 20 of FIGS. 6A to 6D are similar to the light emitting diode 10 of FIGS. 1 to 4. Accordingly, the same or similar elements will be described using the same or similar reference numerals, and repeated or overlapping descriptions will be omitted below for clarity.

Compared to the light emitting diode 10 of FIGS. 1 to 4 having the semicircular solder holes 171 to 173, at least one of the solder holes of the light emitting diode 20 of FIG. 6 has a fan-shaped solder hole in which a portion of an edge of an insulating substrate is etched.

In other words, compared to the light emitting diode 10 of FIGS. 1 to 4 having solder holes 171 to 173 formed by removing the portion of the second insulating substrate 120 in a semicircular shape, the light emitting diode 20 of FIG. 6 has the solder holes formed by cutting at least one edge of a second insulating substrate 120'.

For example, referring to FIGS. 6A to 6D, two edges of the edges of the second insulating substrate 120' may be cut to form first and second solder holes 171' and 172'. In this case, as illustrated, a first lower conductive layer 151' has a shape corresponding to the first solder hole 171', that is, a shape where an edge is cut. A second lower conductive layer 152' has a shape corresponding to the second solder hole 172'.

Figure 7A:
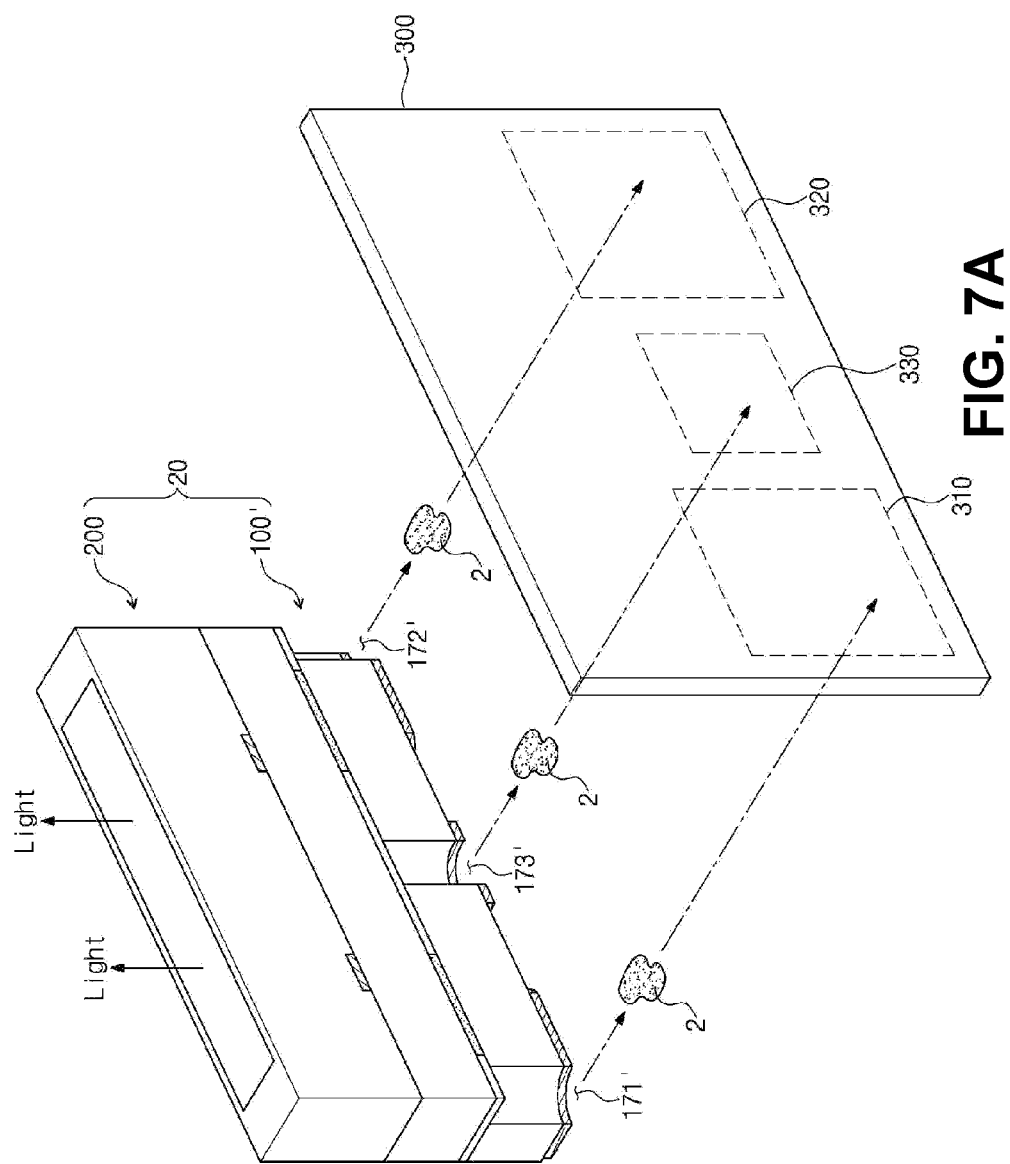
FIGS. 7A and 7B are views illustrating a light emitting diode module formed using a light emitting diode of FIG. 6, where
Figure 7B:
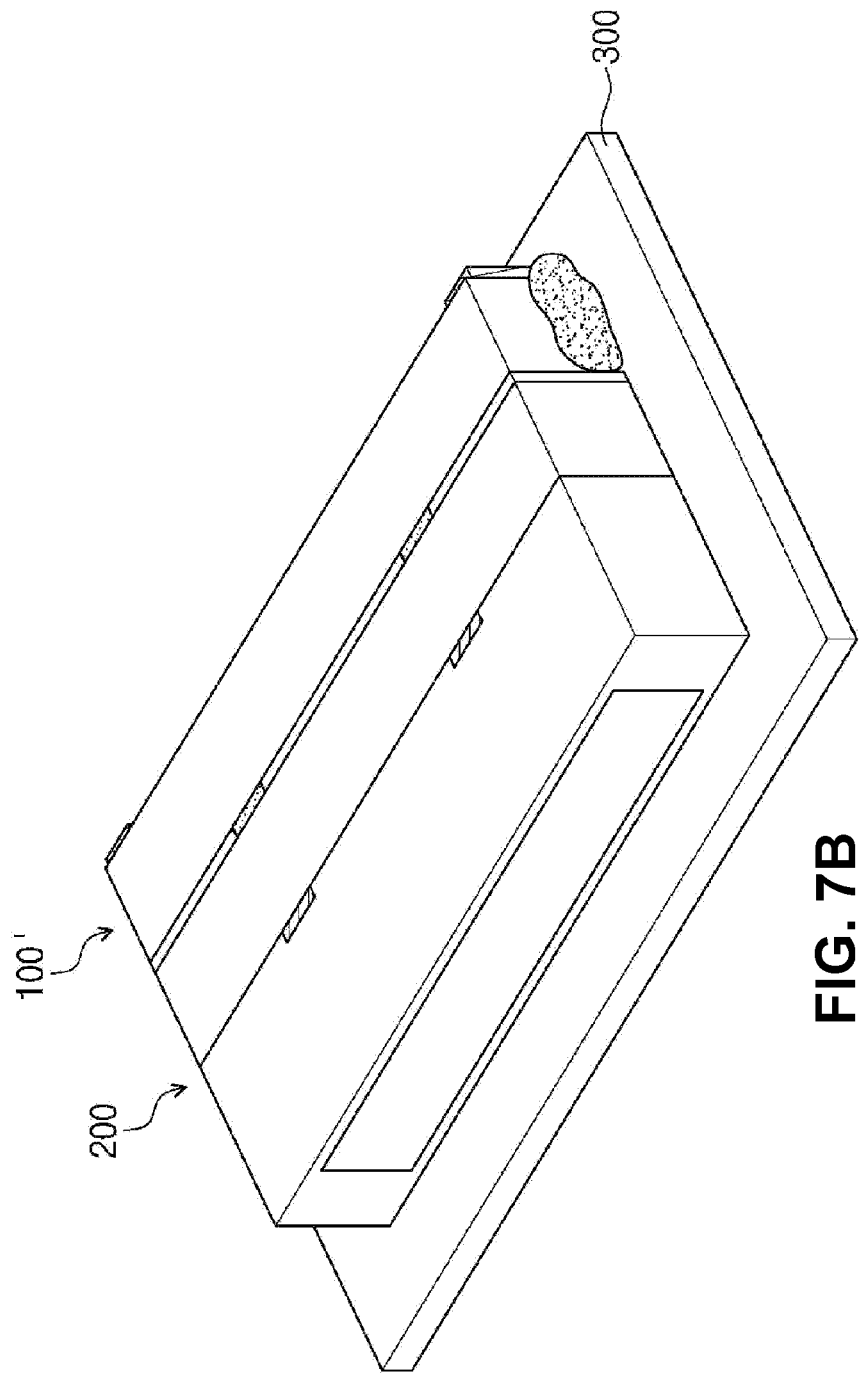

FIGS. 7A and 7B are views illustrating a light emitting diode module formed using the light emitting diode 20 of FIG. 6. In detail, FIG. 7A illustrates an example of bonding the light emitting diode 20 to the substrate 300 using the solder paste "2". FIG. 7B is a view illustrating an example of a completed light emitting diode module.

FIGS. 7A and 7B illustrate the light emitting diode 20, the substrate 300 disposed on the side of the light emitting diode 20, and the solder paste "2" adhering the light emitting diode 20 to the substrate 300. The solder paste "2" is disposed in the first solder hole 171', the second solder hole 172', and the dummy solder hole 173'.

In embodiments according to the present disclosure, the solder paste "2" disposed in the first solder hole 171' may be disposed to surround one side of the second insulating substrate 120', and thus the light emitting diode 20 may be more stably bonded to the substrate 300. Similarly, the solder paste "2" disposed in the second solder hole 172' may be disposed to surround the other side of the second insulating substrate 120', and thus the light emitting diode 20 may be more stably bonded to the substrate 300.

As described above, when the first solder hole 171' and the second solder hole 172' are each formed by cutting a portion of the second insulating substrate 120' to widen an area to be in contact with the solder paste "2", and thus the light emitting diode 20 may be more stably fixed to the substrate 300.

Figure 8A:
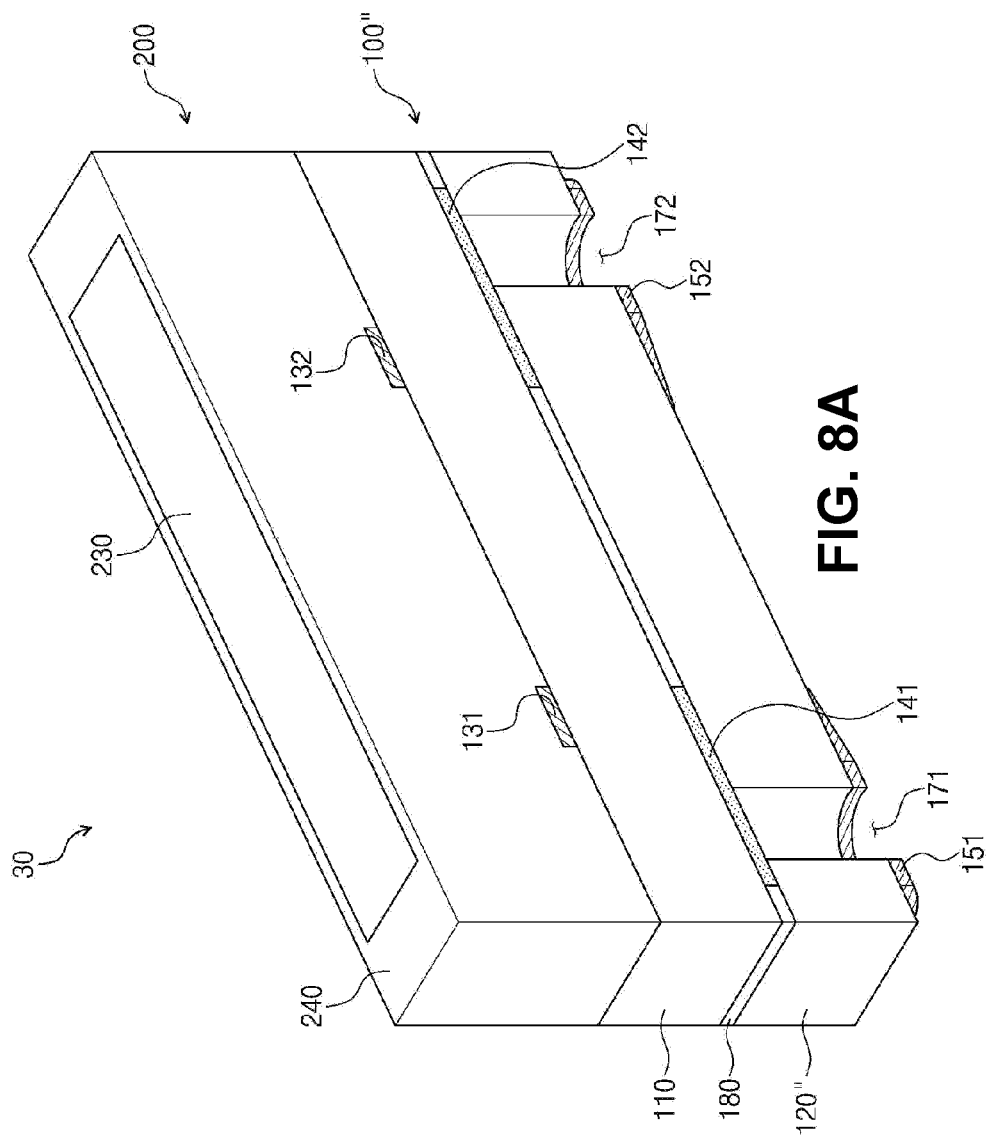
FIGS. 8A through 8D are views illustrating a light emitting diode according to another embodiment of the present disclosure, where
Figure 8B:
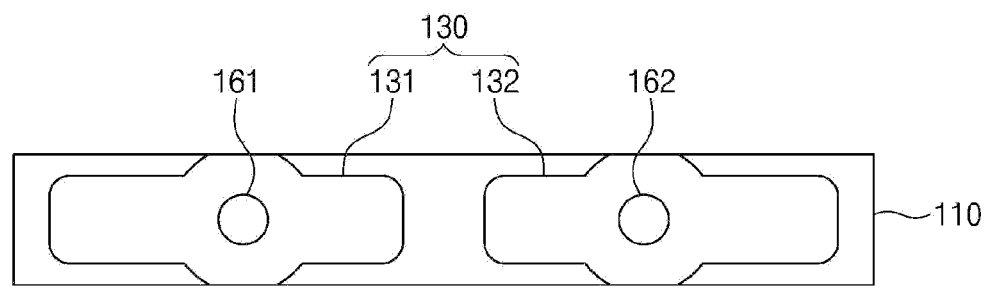
Figure 8C:
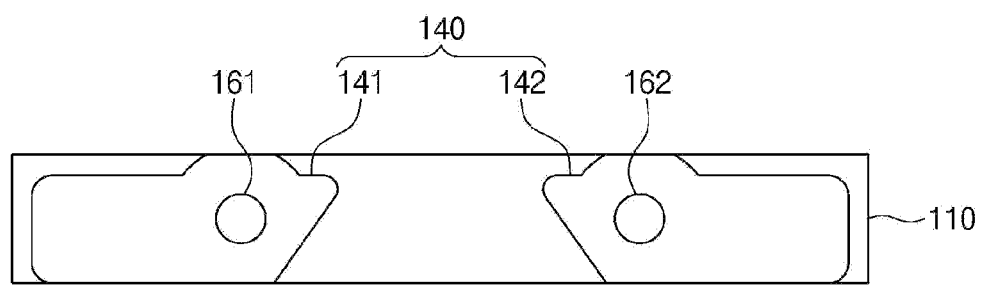
Figure 8D:
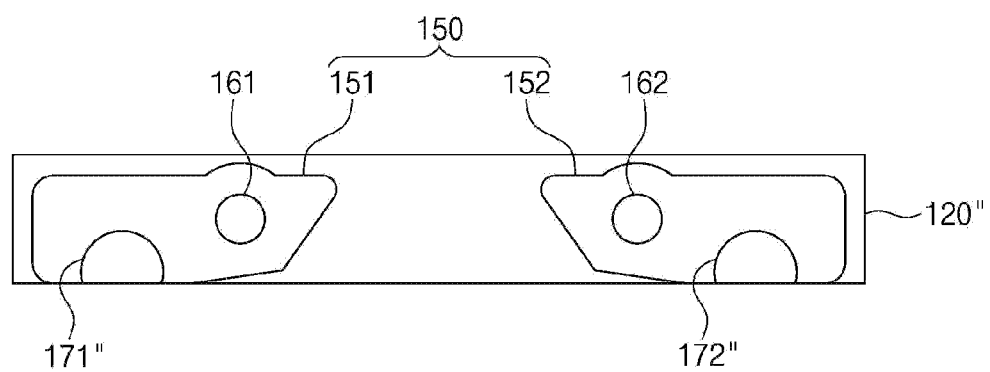

FIGS. 8A to 8D are views illustrating a light emitting diode 30 according to another embodiment of the present disclosure. Specifically, FIG. 8A is a perspective view showing an overall appearance of the light emitting diode 30 according to another embodiment of the present disclosure. FIGS. 8B to 8D are plan views illustrating the first conductive layer 130, the second conductive layer 140, and the third conductive layer 150 included in a lead frame unit 100" of FIG. 8A, respectively.

The light emitting diode 30 of FIGS. 8A to 8D are similar to the light emitting diodes 10 of FIGS. 1 to 4. Accordingly, the same or similar elements will be described using the same or similar reference numerals and repeated or overlapping descriptions will be omitted below for clarity.

Compared to the light emitting diode 10 of FIGS. 1 to 4 in which the dummy solder hole 173 is formed, the dummy solder hole is not formed in the light emitting diode 30 of FIG. 8. That is, the intermediate dummy hole is not formed in a second insulating substrate 120" of the light emitting diode 30 of FIG. 8.

For example, referring to FIGS. 8A to 8D, the intermediate dummy hole is not formed in the second insulating substrate 120". In addition, the lower dummy layer is not formed on the lower surface of the second insulating substrate 120", and the intermediate dummy layer is not formed between the first insulating substrate 110 and the second insulating substrate 120". That is, the light emitting diode 30 of FIG. 8 does not include the dummy terminal.

As described above, the intermediate dummy hole is not formed in the second insulating substrate 120" to increase strength of the second insulating substrate 120" and increase package strength of the light emitting diode 30 itself.

Meanwhile, the second conductive layer 140 and the third conductive layer 150 shown in FIGS. 8A to 8D are exemplary, and the present disclosure is not limited thereto. For example, the second conductive layer 140 and the third conductive layer 150 may be formed in various shapes and sizes. This will be described in more detail with reference to FIG. 9 below.

Figure 9A:
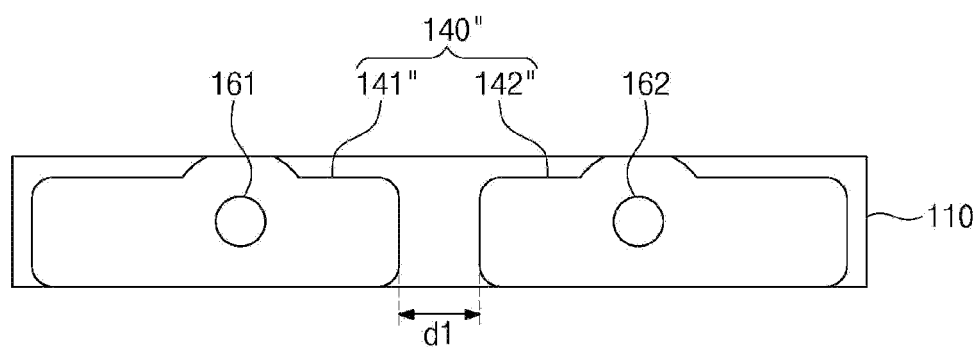
FIGS. 9A and 9B are views illustrating a plan view of a second conductive layer and a third conductive layer, respectively, according to another embodiment of the present disclosure.
Figure 9B:
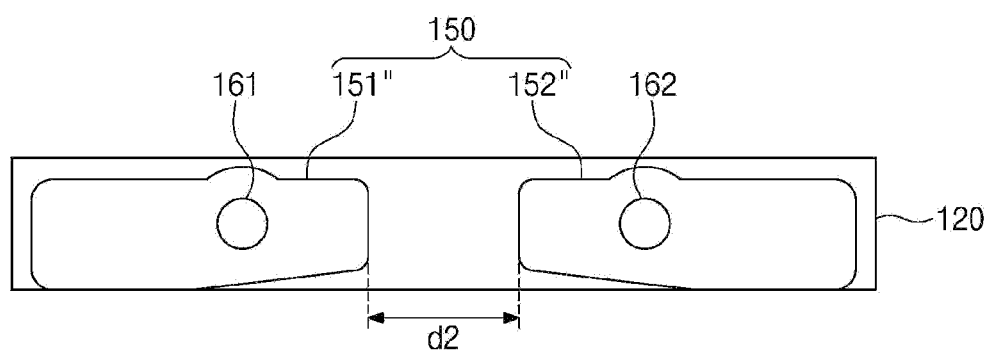

FIGS. 9A and 9B are views illustrating a plan view of a second conductive layer 140" and a third conductive layer 150", respectively, according to another embodiment of the present disclosure.

First, referring to FIG. 9A, the intermediate dummy layer is not formed in the second conductive layer 140". That is, similar to FIG. 8B, the second conductive layer 140" of FIG. 9A includes only a first intermediate conductive layer 141" and a second intermediate conductive layer 142".

In this case, shapes of the first intermediate conductive layer 141" and a second intermediate conductive layer 142", and a distance d1 between the first intermediate conductive layer 141" and the second intermediate conductive layer 142" may vary. For example, as shown in FIG. 9A, the first intermediate conductive layer 141" and the second intermediate conductive layer 142" may be formed to have a large area as compared to the first and second intermediate conductive layers 141 and 142 of FIG. 2. In this case, the distance d1 between the first intermediate conductive layer 141" and the second intermediate conductive layer 142" may be equal to or greater than a margin that does not short-circuited each other.

FIG. 9B, the lower dummy layer is not formed in the third conductive layer 150". In this case, similar to FIG. 9A, shapes of the first lower conductive layer 151" and the second lower conductive layer 152" and a distance d2 between the first lower conductive layer 151" and the second lower conductive layer 152" may vary. For example, as shown in FIG. 9B, in order to increase the contact area with the solder paste, the first lower conductive layer 151" and the second lower conductive layer 152" may be formed to have the largest area possible.

Figure 10A:
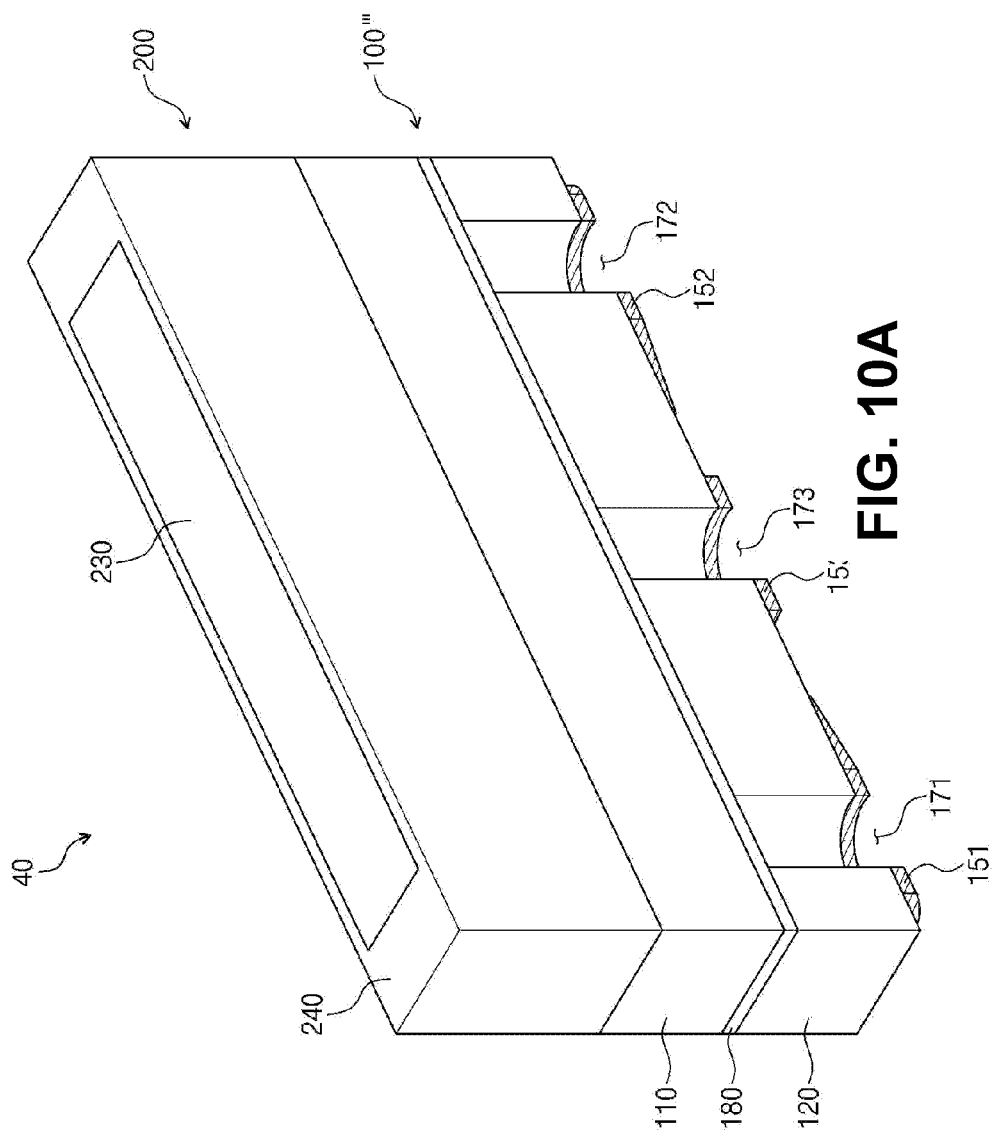
FIGS. 10A through 10D are views illustrating a light emitting diode according to still another embodiment of the present disclosure, where
Figure 10B:
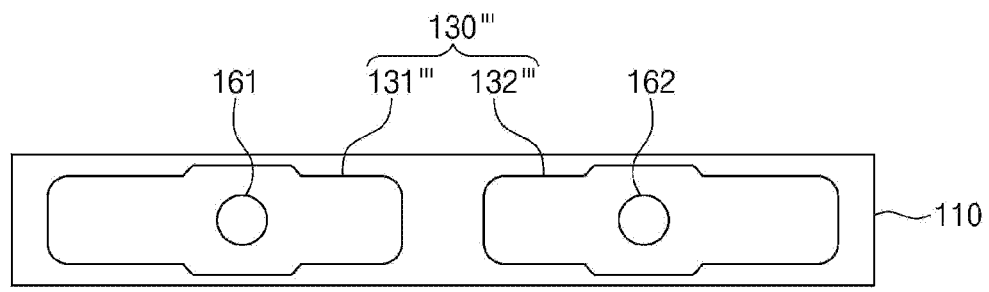
Figure 10C:
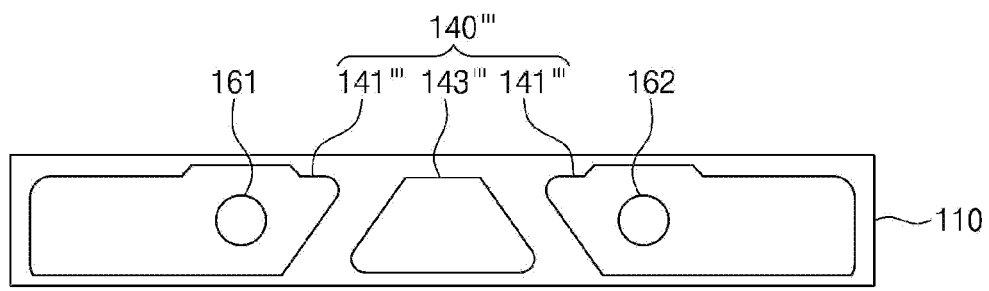
Figure 10D:
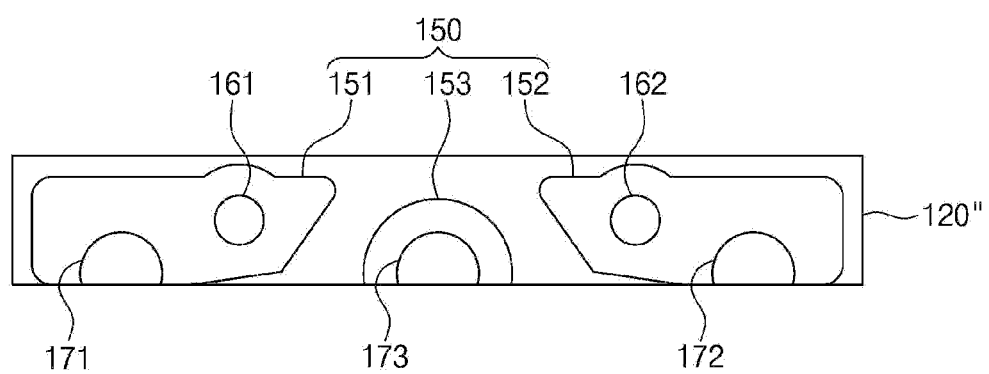

FIGS. 10A to 10D are views illustrating a light emitting diode 40 according to another embodiment of the present disclosure. Specifically, FIG. 10A is a perspective view showing an overall appearance of the light emitting diode 40 according to another embodiment of the present disclosure. FIGS. 10B to 10D are plan views illustrating a first conductive layer 130''', a second conductive layer 140''', and the third conductive layer 150 included in a lead frame unit 100''' of FIG. 10A, respectively.

The light emitting diode 40 of FIGS. 10A to 10D is similar to the light emitting diode 10 of FIGS. 1 to 4. Accordingly, the same or similar elements will be described using the same or similar reference numerals, and repeated or overlapping descriptions will be omitted below for clarity.

Compared to the light emitting diode 10 of FIGS. 1 to 4 including the first and second conductive layers 130 and 140 partially exposed to the outside, the light emitting diode 40 of FIG. 10 does not expose the first and second conductive layers 130''' and 140'''.

For example, referring to FIGS. 10A and 10B, a length of the first conductive layer 130''' in a width direction may be formed to be smaller than a length of the first insulating substrate 110 in a width direction. In this case, a side surface of the first conductive layer 130''' may be surrounded by the housing of the light source unit 200 and the first conductive layer 130''' may not be exposed to the outside.

In addition, referring to FIGS. 10A and 10C, a length of the second conductive layer 140''' in a width direction may be formed to be smaller than the length of the first insulating substrate 110 in the width direction. In this case, a side surface of the second conductive layer 140''' may be surrounded by the adhesive layer 180 (see FIG. 1), and thus the second conductive layer 140''' may not be exposed to the outside.

As described above, a portion of the first and second conductive layers 130''' and 140''' is not exposed, and thus the light emitting diode 40 according to an embodiment of the present disclosure may block external moisture to improve reliability and lifespan.

Figure 11A:
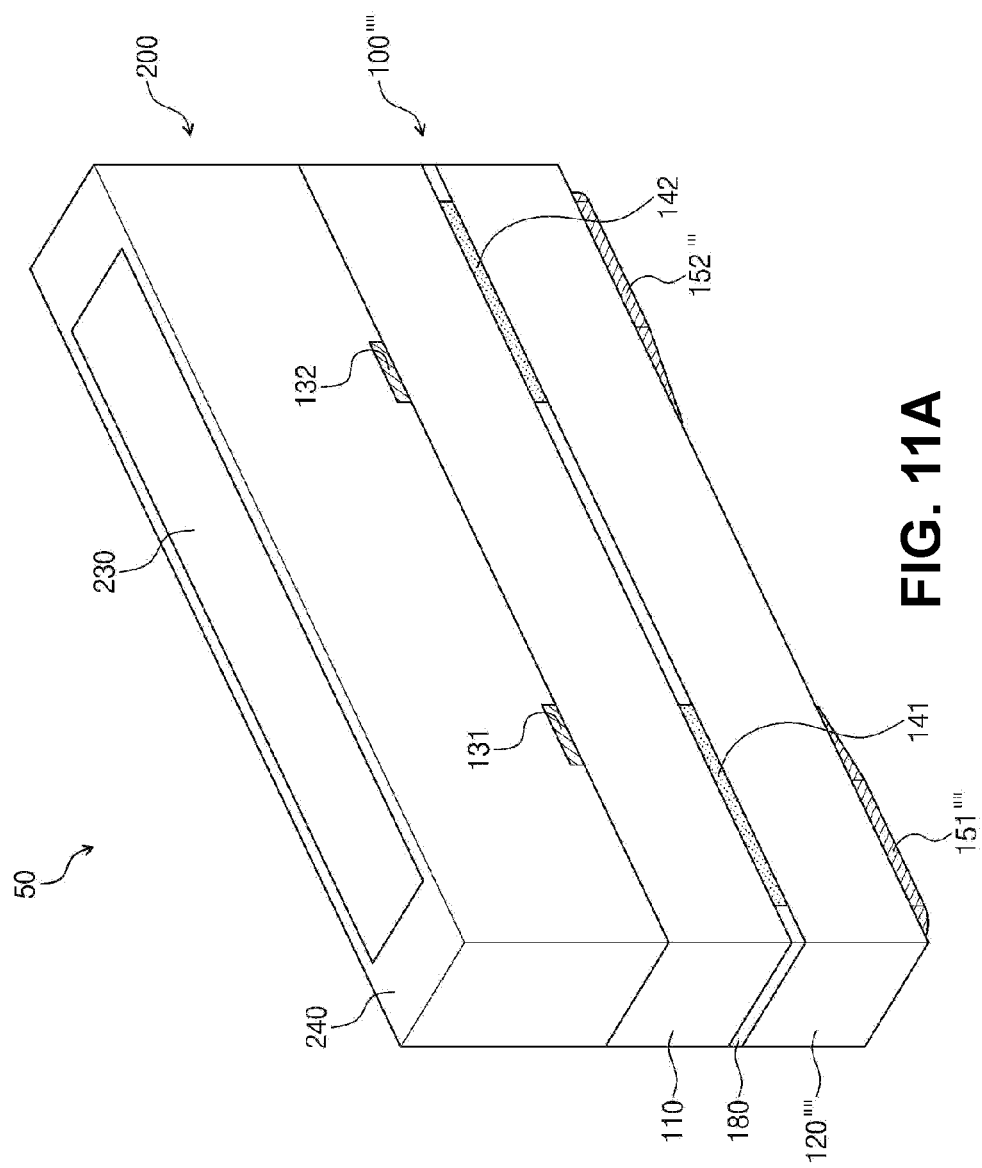
FIGS. 11A through 11D are views illustrating a light emitting diode according to still another embodiment of the present disclosure, where
Figure 11B:
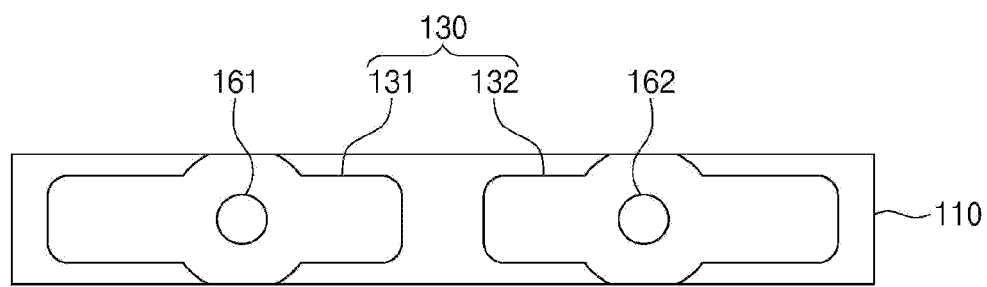
Figure 11C:
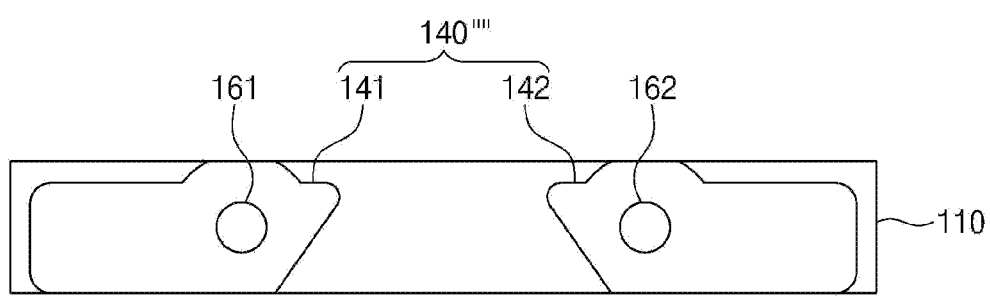
Figure 11D:
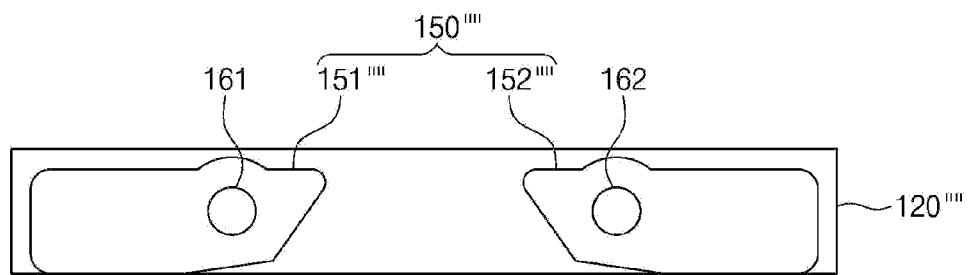

FIGS. 11A to 11D are views illustrating a light emitting diode 50 according to another embodiment of the present disclosure. Specifically, FIG. 11A is a perspective view illustrating an overall appearance of the light emitting diode 50 according to another embodiment of the present disclosure. FIGS. 11B to 11D are plan views illustrating the first conductive layer 130, a second conductive layer 140'''' and a third conductive layer 150'''' included in a lead frame unit 100'''' of FIG. 11A, respectively.

The light emitting diode 50 of FIGS. 11A to 11D is similar to the light emitting diode 10 of FIGS. 1 to 4. Accordingly, the same or similar elements will be described using the same or similar reference numerals and repeated or overlapping descriptions will be omitted below for clarity.

Compared to the light emitting diode 10 of FIGS. 1 to 4 having solder holes 171 to 173, the light emitting diode 50 of FIG. 11 does not have solder holes. That is, the solder holes are not formed in the lead frame unit 100'''' of the light emitting diode 50 of FIG. 11. As described above, when the lead frame unit 100'''' does not have a plurality of solder holes, the manufacturing process for forming the solder holes is not necessary, and thus there are advantages that a process is simplified and strength of the lead frame unit 100'''' is increased. In this case, as shown in FIGS. 11C and 11D, the intermediate dummy layer and the lower dummy layer may not be formed.

Figure 12A:
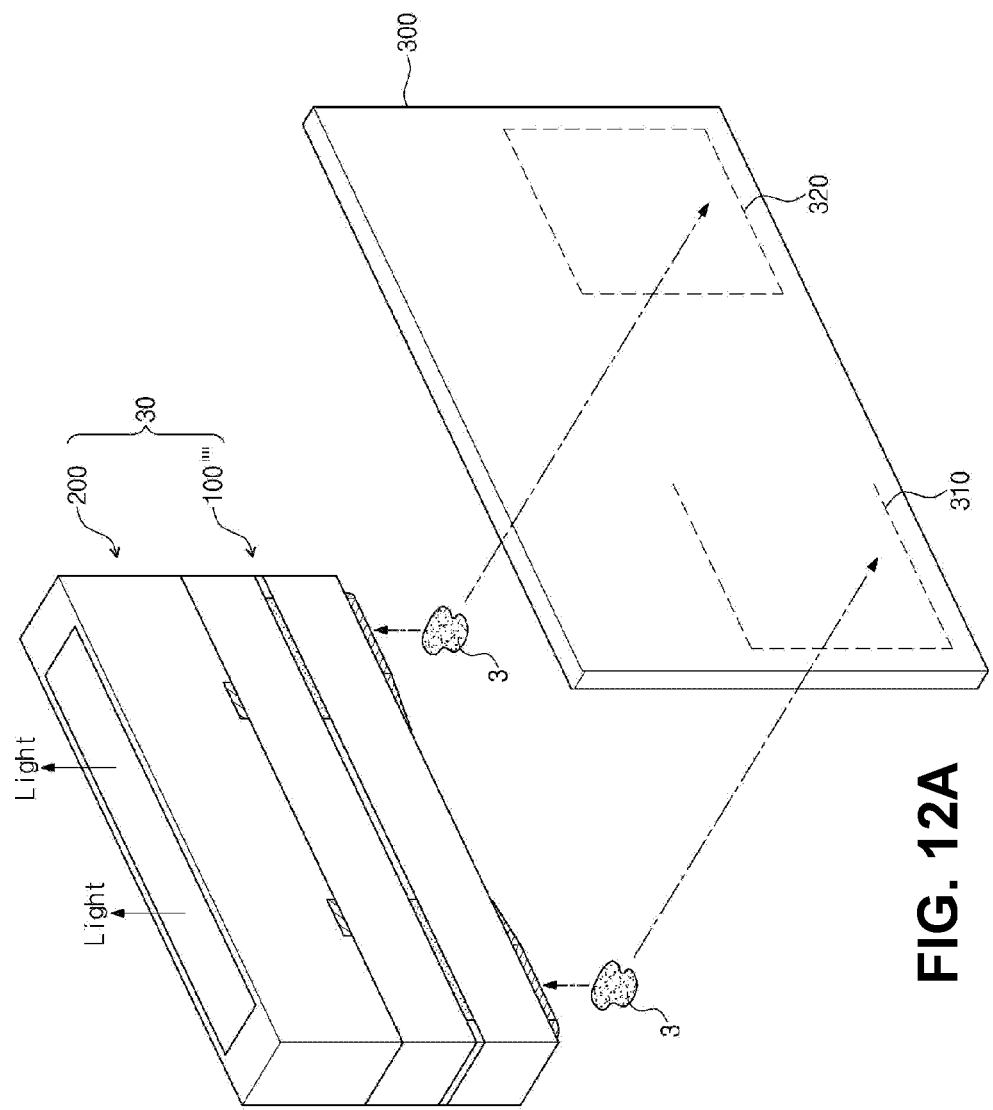
FIGS. 12A and 12B are views illustrating a light emitting diode module formed using a light emitting diode of FIG. 11.
Figure 12B:
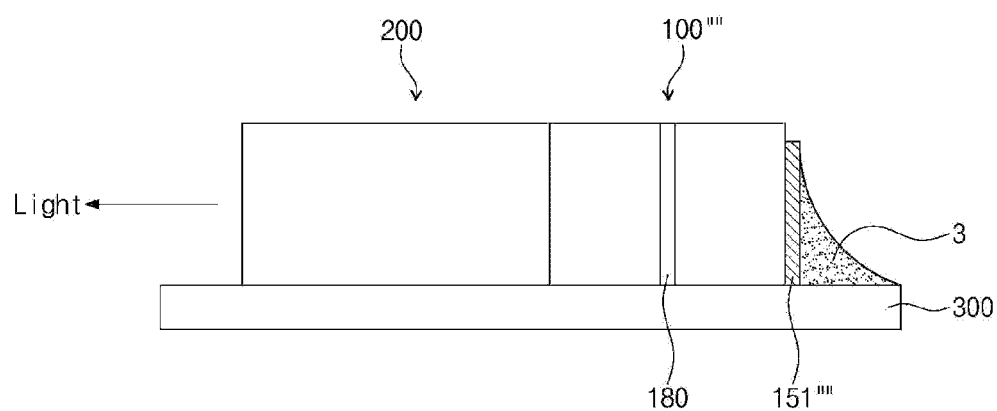

FIGS. 12A and 12B are views illustrating a light emitting diode module formed using the light emitting diode 50 of FIG. 11. In detail, FIG. 12A illustrates an example of bonding the light emitting diode 50 to the substrate 300 using a solder paste "3". FIG. 11B is a view showing a side of a completed light emitting diode module.

Referring to FIGS. 12A and 12B, the solder paste "3" covers a first lower conductive layer 151'''' in a back direction of the light emitting diode 30 to allow the first lower conductive layer 151'''' to be bonded to the first electrode 310 of the substrate 300. Similarly, the solder paste "3" covers a second lower conductive layer 152'''' in the back direction of the light emitting diode 30 to allow the second lower conductive layer 152'''' to be bonded to the second electrode 320 of the substrate 300.

Meanwhile, the above description is an example and the technical spirit of the present disclosure is not limited thereto. For example, in order to increase adhesion to the substrate 300 (see FIG. 12A), a lower dummy layer may be further formed on a bottom surface of a second insulating substrate 120''''.

Figure 13A:
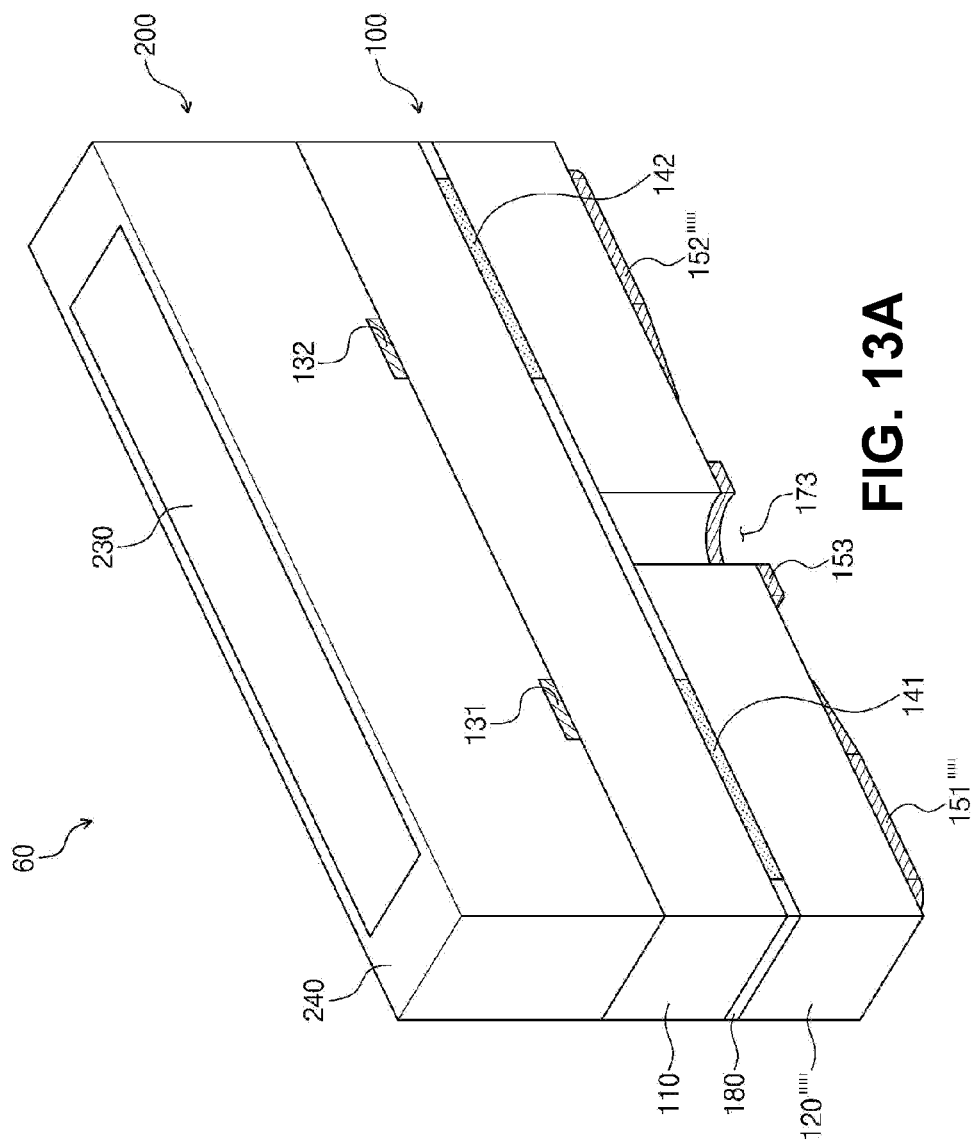
FIGS. 13A through 13D are views illustrating a light emitting diode according to still another embodiment of the present disclosure, where
Figure 13B:
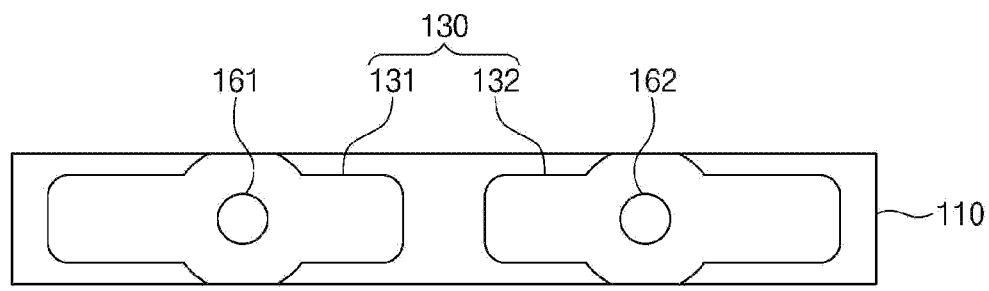
Figure 13C:
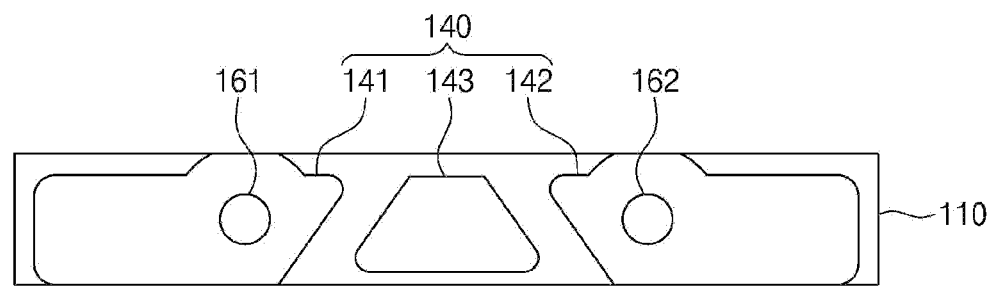
Figure 13D:
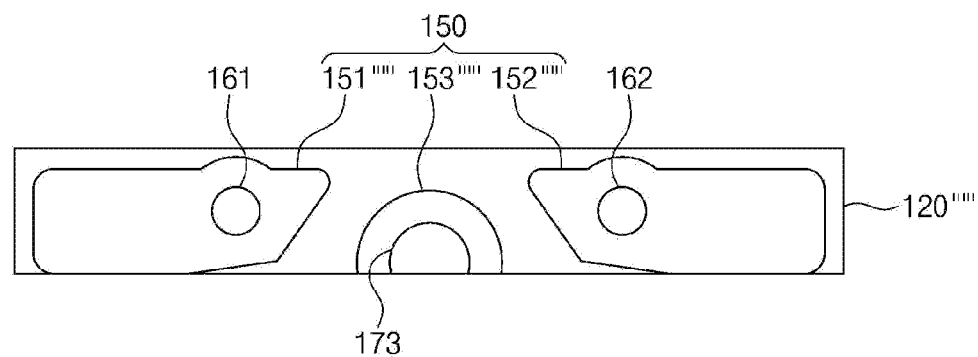

FIGS. 13A to 13D are views illustrating a light emitting diode 60 according to another embodiment of the present disclosure. Specifically, FIG. 13A is a perspective view showing an overall appearance of the light emitting diode 60 according to another embodiment of the present disclosure. FIGS. 13B to 13D are plan views illustrating the first conductive layer 130, the second conductive layer 140, and the third conductive layer 150 included in the lead frame unit 100 of FIG. 13A, respectively.

The light emitting diode 60 of FIGS. 13A to 13D are similar to the light emitting diode 10 of FIGS. 1 to 4. Accordingly, the same or similar elements will be described using the same or similar reference numerals and repeated or overlapping descriptions will be omitted below for clarity.

Compared to the light emitting diode 10 of FIGS. 1 to 4 including the plurality of solder holes 170 to 173, the light emitting diode 60 of FIG. 13 includes only the dummy solder hole 173. That is, only the dummy solder hole 173 is formed in a second insulating substrate 120''''' of FIG. 13A.

In this case, referring to FIGS. 13A and 13D, the lower dummy layer 153 includes an opening corresponding to the dummy solder hole 173, but an opening is not formed in a first lower conductive layer 151''''' and the second lower conductive layer 152'''''.

As described above, when only the dummy solder hole 173 is formed, not only the heat dissipation characteristic may be improved by the dummy terminal, but also the strength of the lead frame unit 100 by the many solder holes may be prevented from weakening.

Figure 14:
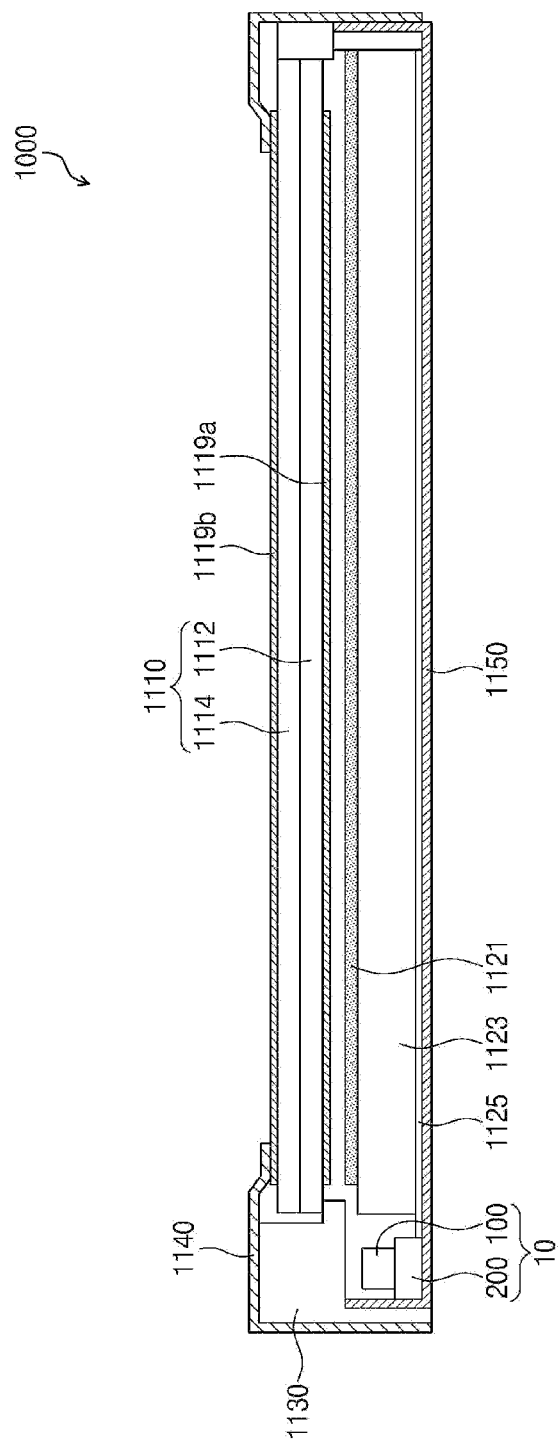
FIG. 14 is a cross-sectional view illustrating an example of a display device disposed with a light emitting diode module of the present disclosure.

FIG. 14 is a cross-sectional view illustrating an example of a display device 1000 disposed with a light emitting diode module of the present disclosure. Referring to FIG. 14, the display device 1000 includes a liquid crystal panel 1110, a backlight unit 1120, a support main 1130, a cover bottom 1150, and a top cover 1140.

The liquid crystal panel 1110 is composed of first and second substrates 1112 and 1114 bonded to each other with a liquid crystal layer interposed therebetween as a part that plays a key role in image expression. The backlight unit is disposed behind the liquid crystal panel 1110.

The backlight unit includes a light emitting diode module arranged along at least one side edge longitudinal direction of the support main 1130, a white or silver reflective plate 1125 seated on the cover bottom 1150, a light guide plate 1123 mounted on the reflective plate 1125, and a plurality of optical sheets interposed thereon.

In an embodiment of the present disclosure, the light emitting diode module may include light emitting diodes 10, 20, and 30 described with reference to FIGS. 1 to 9 and may be implemented as a side type light emitting diode module.

Therefore, because the light emitting diode module disposed to the backlight unit effectively radiates the heat, the display device 1000 of FIG. 10 may have a small temperature rise even when used for a long time and display an image stably without changing luminance.

Although described above with reference to a preferred embodiment of the present invention, those skilled in the art or those of ordinary skill in the art will understand that various modifications and changes may be made in the present invention without departing from the spirit and scope of the invention as set forth in the claims below.

Therefore, the technical scope of the present invention should not be limited to the contents described in the detailed description of the specification but should be defined by the claims.

I claim:

1. A lighting device, comprising:
   a bottom cover including a main region extending along a first direction and a bending region extending in a second direction crossing the first direction, the main region having a middle portion, a first edge portion disposed on a first side of the middle portion, and a second edge portion disposed on a second side of the middle portion;
   a module substrate disposed on the first edge portion of the bottom cover;
   a light emitter connected to the module substrate and having a light source and a lead frame unit electrically connecting the light source to the module substrate;
   a heat path connecting the module substrate and the light emitter;
   a light guide plate disposed on the bottom cover; and
   wherein the heat path is disposed to be closer to an edge of the module substrate than a middle of the module substrate, and
   wherein a surface of the light source is perpendicular to a surface of the main region of the bottom cover.

2. The lighting device of claim 1, further comprising a reflection plate disposed between the bottom cover and the light guide plate.

3. The lighting device of claim 1, wherein the light emitter is configured to emit light in a direction parallel to the main region of the bottom cover.

4. The lighting device of claim 1, wherein the light emitter further includes a wavelength converter and an insulator surrounding the wavelength converter.

5. The lighting device of claim 4, the wavelength converter is disposed between the bending region and the light guide plate and configured to face to a side surface of the light guide plate.

6. The lighting device of claim 4, wherein the insulator has a region parallel with the main region of the bottom cover.

7. A lighting device, comprising:
   a bottom cover including a main region extending along a first direction and a bending region extending in a second direction crossing the first direction, the main region having a middle portion, a first edge portion disposed on a first side of the middle portion, and a second edge portion disposed on a second side of the middle portion;
   a module substrate disposed on the first edge portion of the bottom cover;
   a light emitter connected to the module substrate and having a light source and a lead frame unit electrically connect the light source to the module substrate;
   a heat path connecting the module substrate and the light emitter;
   a wavelength converter covering the light source;
   a light guide plate disposed on the bottom cover; and
   wherein the wavelength converter is disposed between the bending region and the light guide plate and configured to face to a side surface of the light guide plate, and
   wherein a surface of the light source is perpendicular to a surface of the main region of the bottom cover.

8. The lighting device of claim 7, the light emitter is configured to emit light in a direction parallel to the main region of the bottom cover.

9. The lighting device of claim 7, the module substrate further includes a heat path disposed between the module substrate and the light emitter.

10. The lighting device of claim 9, wherein the heat path is disposed to be closer to an edge of the module substrate than a middle of the module substrate.

11. The lighting device of claim 7, wherein the light emitter further includes an insulator surrounding the wavelength converter, and the insulator has a region parallel with the main region of the bottom cover.

12. The lighting device of claim 7, further comprising a reflection plate disposed between the bottom cover and the light guide plate.

13. A lighting device, comprising:
    a bottom cover including a main region extending along a first direction and a bending region extending in a second direction crossing the first direction, the main region having a middle portion, a first edge portion disposed on a first side of the middle portion, and a second edge portion disposed on a second side of the middle portion;
    a module substrate disposed on the first edge portion of the bottom cover;
    a light emitter connected to the module substrate and including a light source and a lead frame unit electrically connecting the light source to the module substrate;
    a heat path connecting the module substrate and the light emitter;
    a light guide plate disposed on the bottom cover; and
    a reflection plate disposed between the bottom cover and the light guide plate,
    wherein a surface of the light source is perpendicular to a surface of the main region of the bottom cover.

14. The lighting device of claim 13, wherein the light emitter is configured to emit light in a direction parallel to the main region of the bottom cover.

15. The lighting device of claim 13, wherein the light emitter further includes a wavelength converter and an insulator surrounding the wavelength converter.

16. The lighting device of claim 15, the wavelength converter is disposed between the bending region and the light guide plate and face to a side surface of the light guide plate.

17. The lighting device of claim 15, wherein the insulator has a region parallel with the main region of the bottom cover.

18. The lighting device of claim 13, the module substrate further includes a heat path disposed between the module substrate and the light emitter.

19. The lighting device of claim 18, the heat path is disposed to be closer to an edge of the module substrate than a middle of the module substrate.

20. The lighting device of claim 19, the heat path has an electrical conductivity.

* * * * *